US012628524B2

(12) United States Patent
Cho et al.

(10) Patent No.: US 12,628,524 B2
(45) Date of Patent: May 12, 2026

(54) DISPLAY DEVICE AND ELECTRONIC DEVICE HAVING THE SAME

(71) Applicant: Samsung Display Co., LTD., Yongin-si (KR)

(72) Inventors: Jung-Hyun Cho, Yongin-si (KR); Gun Woo Ko, Yongin-si (KR); Chi Wook An, Yongin-si (KR); Beohm Rock Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 455 days.

(21) Appl. No.: 18/125,269

(22) Filed: Mar. 23, 2023

(65) Prior Publication Data

US 2024/0040890 A1 Feb. 1, 2024

(30) Foreign Application Priority Data

Jul. 27, 2022 (KR) ........................ 10-2022-0093214

(51) Int. Cl.
| | |
|---|---|
| *H10K 59/40* | (2023.01) |
| *G06F 3/041* | (2006.01) |
| *G06F 3/044* | (2006.01) |
| *H10K 59/122* | (2023.01) |
| *H10K 59/80* | (2023.01) |

(52) U.S. Cl.
CPC ........... *H10K 59/40* (2023.02); *G06F 3/0446* (2019.05); *H10K 59/122* (2023.02); *H10K 59/873* (2023.02); *H10K 59/879* (2023.02); *G06F 3/0412* (2013.01); *G06F 3/0448* (2019.05)

(58) Field of Classification Search
CPC .... G06F 3/0446; G06F 3/0412; G06F 3/0448; G06F 2203/04112; H10K 59/40; H10K 59/122; H10K 59/873; H10K 59/879; H10K 59/124; H10K 59/131; H10K 59/65;
(Continued)

(56) References Cited

U.S. PATENT DOCUMENTS

| | | | |
|---|---|---|---|
| 6,072,450 A | 6/2000 | Yamada et al. | |
| 7,535,646 B2 | 5/2009 | Chari et al. | |

(Continued)

FOREIGN PATENT DOCUMENTS

| | | |
|---|---|---|
| KR | 10-2016-0054720 | 5/2016 |
| KR | 10-2021-0072464 | 6/2021 |

(Continued)

*Primary Examiner* — Jimmy H Nguyen
(74) *Attorney, Agent, or Firm* — Innovation Counsel LLP

(57) ABSTRACT

A display device includes pixel electrodes disposed on a substrate; a pixel defining layer disposed on the pixel electrodes that include pixel openings overlapping the pixel electrodes in a plan view, respectively; an encapsulation layer disposed on the pixel electrodes and the pixel defining layer; a sensing electrode disposed on the encapsulation layer; a first insulating layer disposed on the sensing electrode that has openings overlapping the pixel openings in a plan view, respectively; and a second insulating layer disposed on the first insulating layer that has a higher refractive index than a refractive index of the first insulating layer, and each of the openings of the first insulating layer includes at least one protruding extension, and protruding directions of the at least one protruding extension formed in each of the openings include at least eight directions.

20 Claims, 28 Drawing Sheets

(58) Field of Classification Search
     CPC ...... H10K 59/60; H10K 50/858; H10K 50/81;
                                          H10K 50/844
     USPC .................................................. 345/76, 173
     See application file for complete search history.

(56)                    References Cited

U.S. PATENT DOCUMENTS

|  |  |  |
| --- | --- | --- |
| 9,142,802 B2 | 9/2015 | Miyamoto et al. |
| 2015/0333108 A1 | 11/2015 | Miyamoto et al. |
| 2019/0165061 A1* | 5/2019 | Jung .................... H10K 59/879 |
| 2021/0043697 A1* | 2/2021 | Kim ..................... H10K 59/352 |
| 2022/0140288 A1 | 5/2022 | Ji et al. |
| 2022/0231089 A1 | 7/2022 | Cho et al. |
| 2024/0008338 A1 | 1/2024 | Cho et al. |

FOREIGN PATENT DOCUMENTS

| KR | 10-2021-0086260 | 7/2021 |
| --- | --- | --- |
| KR | 10-2022-0058716 | 5/2022 |
| KR | 10-2022-0106264 | 7/2022 |
| KR | 10-2023-0164266 | 12/2023 |

* cited by examiner (A)          (B)

FIG. 14A

| B1 | R1 | B1 | R1 | B1 | R1 |
|----|----|----|----|----|----|
| R2 | B2 | R2 | B2 | R2 | B2 |
| B1 | R1 | B1 | R1 | B1 | R1 |
| R2 | B2 | R2 | B2 | R2 | B2 |
| B1 | R1 | B1 | R1 | B1 | R1 |
| R2 | B2 | R2 | B2 | R2 | B2 |

FIG. 14B

| B1 | R2 | B1 | R2 | B1 | R2 |
|----|----|----|----|----|----|
| R1 | B2 | R1 | B2 | R1 | B2 |
| B1 | R2 | B1 | R2 | B1 | R2 |
| R1 | B2 | R1 | B2 | R1 | B2 |
| B1 | R2 | B1 | R2 | B1 | R2 |
| R1 | B2 | R1 | B2 | R1 | B2 |

FIG. 14C

| B1 | R1 | B2 | R2 | B1 | R1 |
|----|----|----|----|----|----|
| R1 | B1 | R2 | B2 | R1 | B1 |
| B2 | R2 | B1 | R1 | B2 | R2 |
| R2 | B2 | R1 | B1 | R2 | B2 |
| B1 | R1 | B2 | R2 | B1 | R1 |
| R1 | B1 | R2 | B2 | R1 | B1 |

FIG. 14D

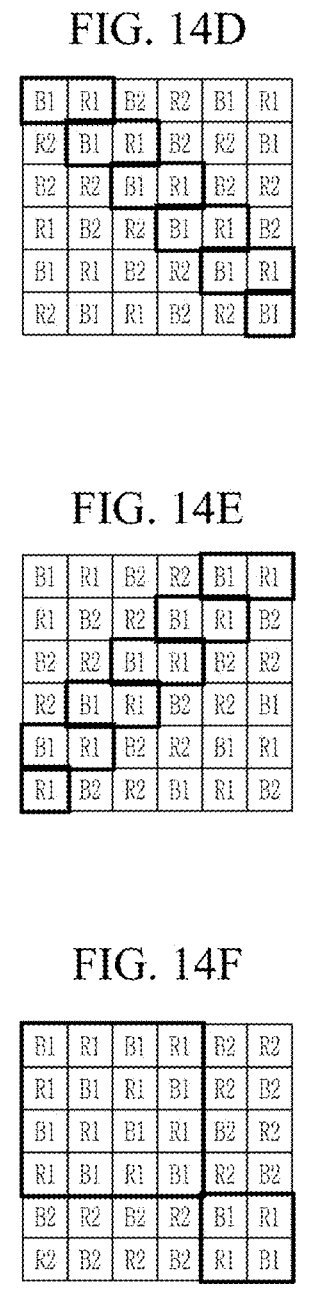

| B1 | R1 | B2 | R2 | B1 | R1 |
|----|----|----|----|----|----|
| R2 | B1 | R1 | B2 | R2 | B1 |
| B2 | R2 | B1 | R1 | B2 | R2 |
| R1 | B2 | R2 | B1 | R1 | B2 |
| B1 | R1 | B2 | R2 | B1 | R1 |
| R2 | B1 | R1 | B2 | R2 | B1 |

FIG. 14E

| B1 | R1 | B2 | R2 | B1 | R1 |
|----|----|----|----|----|----|
| R1 | B2 | R2 | B1 | R1 | B2 |
| B2 | R2 | B1 | R1 | B2 | R2 |
| R2 | B1 | R1 | B2 | R2 | B1 |
| B1 | R1 | B2 | R2 | B1 | R1 |
| R1 | B2 | R2 | B1 | R1 | B2 |

FIG. 14F

| B1 | R1 | B1 | R1 | B2 | R2 |
|----|----|----|----|----|----|
| R1 | B1 | R1 | B1 | R2 | B2 |
| B1 | R1 | B1 | R1 | B2 | R2 |
| R1 | B1 | R1 | B1 | R2 | B2 |
| B2 | R2 | B2 | R2 | B1 | R1 |
| R2 | B2 | R2 | B2 | R1 | B1 |

FIG. 15A

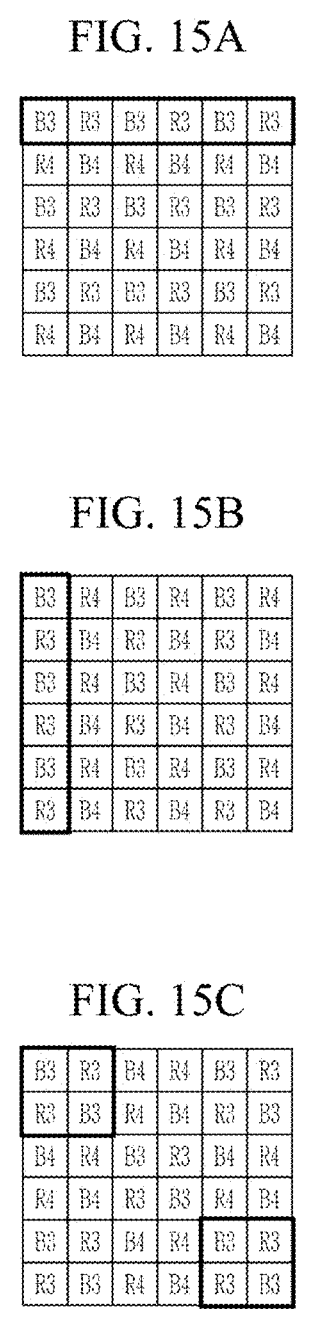

| B3 | R3 | B3 | R3 | B3 | R3 |
|----|----|----|----|----|----|
| R4 | B4 | R4 | B4 | R4 | B4 |
| B3 | R3 | B3 | R3 | B3 | R3 |
| R4 | B4 | R4 | B4 | R4 | B4 |
| B3 | R3 | B3 | R3 | B3 | R3 |
| R4 | B4 | R4 | B4 | R4 | B4 |

FIG. 15B

| B3 | R4 | B3 | R4 | B3 | R4 |
|----|----|----|----|----|----|
| R3 | B4 | R3 | B4 | R3 | B4 |
| B3 | R4 | B3 | R4 | B3 | R4 |
| R3 | B4 | R3 | B4 | R3 | B4 |
| B3 | R4 | B3 | R4 | B3 | R4 |
| R3 | B4 | R3 | B4 | R3 | B4 |

FIG. 15C

| B3 | R2 | B4 | R4 | B3 | R3 |
|----|----|----|----|----|----|
| R3 | B3 | R4 | B4 | R3 | B3 |
| B4 | R4 | B3 | R3 | B4 | R4 |
| R4 | B4 | R3 | B3 | R4 | B4 |
| B3 | R3 | B4 | R4 | B3 | R3 |
| R3 | B3 | R4 | B4 | R3 | B3 |

FIG. 15D

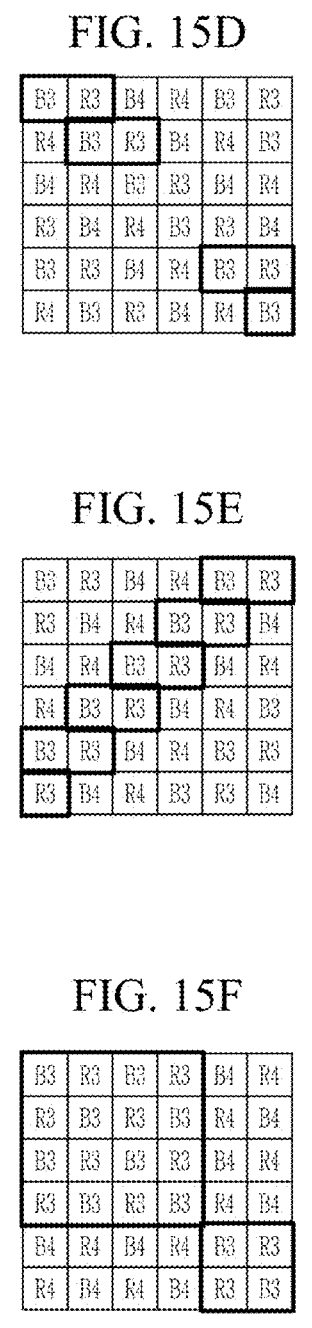

| B3 | R3 | B4 | R4 | B3 | R3 |
|----|----|----|----|----|----|
| R4 | B3 | R3 | B4 | R4 | B3 |
| B4 | R4 | B3 | R3 | B4 | R4 |
| R3 | B4 | R4 | B3 | R3 | B4 |
| B3 | R3 | B4 | R4 | B3 | R3 |
| R4 | B3 | R3 | B4 | R4 | B3 |

FIG. 15E

| B3 | R3 | B4 | R4 | B3 | R3 |
|----|----|----|----|----|----|
| R3 | B4 | R4 | B3 | R3 | B4 |
| B4 | R4 | B3 | R3 | B4 | R4 |
| R4 | B3 | R3 | B4 | R4 | B3 |
| B3 | R3 | B4 | R4 | B3 | R3 |
| R3 | B4 | R4 | B3 | R3 | B4 |

FIG. 15F

| B3 | R3 | B3 | R3 | B4 | R4 |
|----|----|----|----|----|----|
| R3 | B3 | R3 | B3 | R4 | B4 |
| B3 | R3 | B3 | R3 | B4 | R4 |
| R3 | B3 | R3 | B3 | R4 | B4 |
| B4 | R4 | B4 | R4 | B3 | R3 |
| R4 | B4 | R4 | B4 | R3 | B3 |

FIG. 16A

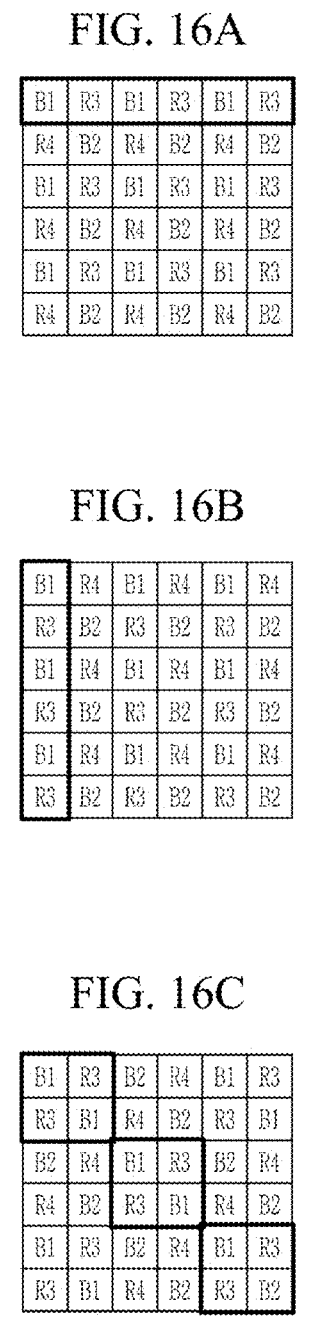

| B1 | R3 | B1 | R3 | B1 | R3 |
|----|----|----|----|----|----|
| R4 | B2 | R4 | B2 | R4 | B2 |
| B1 | R3 | B1 | R3 | B1 | R3 |
| R4 | B2 | R4 | B2 | R4 | B2 |
| B1 | R3 | B1 | R3 | B1 | R3 |
| R4 | B2 | R4 | B2 | R4 | B2 |

FIG. 16B

| B1 | R4 | B1 | R4 | B1 | R4 |
|----|----|----|----|----|----|
| R3 | B2 | R3 | B2 | R3 | B2 |
| B1 | R4 | B1 | R4 | B1 | R4 |
| R3 | B2 | R3 | B2 | R3 | B2 |
| B1 | R4 | B1 | R4 | B1 | R4 |
| R3 | B2 | R3 | B2 | R3 | B2 |

FIG. 16C

| B1 | R3 | B2 | R4 | B1 | R3 |
|----|----|----|----|----|----|
| R3 | B1 | R4 | B2 | R3 | B1 |
| B2 | R4 | B1 | R3 | B2 | R4 |
| R4 | B2 | R3 | B1 | R4 | B2 |
| B1 | R3 | B2 | R4 | B1 | R3 |
| R3 | B1 | R4 | B2 | R3 | B2 |

FIG. 16D

| B1 | R3 | B2 | R4 | B1 | R3 |
|----|----|----|----|----|----|
| R4 | B1 | R3 | B2 | R4 | B1 |
| B2 | R4 | B1 | R3 | B2 | R4 |
| R3 | B2 | R4 | B1 | R3 | B2 |
| B1 | R3 | B2 | R4 | B1 | R3 |
| R4 | B1 | R3 | B2 | R4 | B1 |

FIG. 16E

| B1 | R3 | B2 | R4 | B1 | R3 |
|----|----|----|----|----|----|
| R3 | B2 | R4 | B1 | R3 | B2 |
| B2 | R4 | B1 | R3 | B2 | R4 |
| R4 | B1 | R3 | B2 | R4 | B1 |
| B1 | R3 | B2 | R4 | B1 | R3 |
| R3 | B2 | R4 | B1 | R3 | B2 |

FIG. 16F

| B1 | R3 | B1 | R3 | B2 | R4 |
|----|----|----|----|----|----|
| R3 | B1 | R3 | B1 | R4 | B2 |
| B1 | R3 | B1 | R3 | B2 | R4 |
| R3 | B1 | R3 | B1 | R2 | B2 |
| B2 | R4 | B2 | R4 | B1 | R3 |
| R4 | B2 | R4 | B2 | R3 | B1 |

FIG. 17A

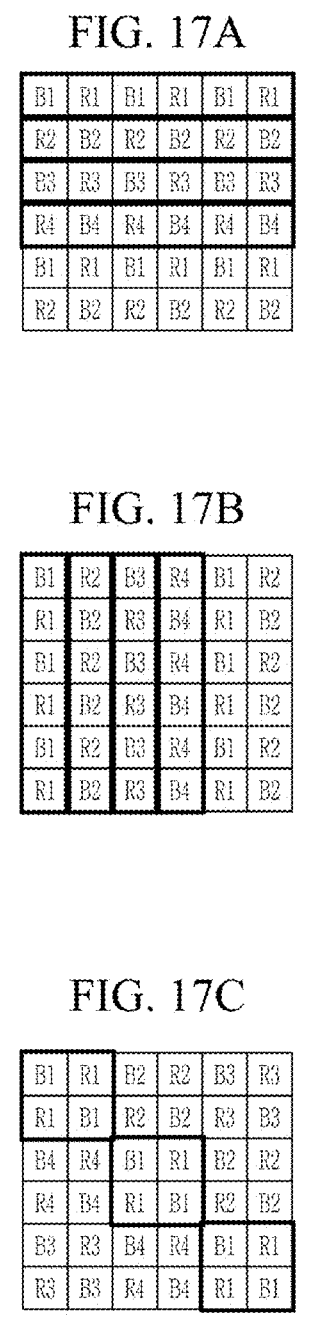

| B1 | R1 | B1 | R1 | B1 | R1 |
|----|----|----|----|----|----|
| R2 | B2 | R2 | B2 | R2 | B2 |
| B3 | R3 | B3 | R3 | B3 | R3 |
| R4 | B4 | R4 | B4 | R4 | B4 |
| B1 | R1 | B1 | R1 | B1 | R1 |
| R2 | B2 | R2 | B2 | R2 | B2 |

FIG. 17B

| B1 | R2 | B3 | R4 | B1 | R2 |
|----|----|----|----|----|----|
| R1 | B2 | R3 | B4 | R1 | B2 |
| B1 | R2 | B3 | R4 | B1 | R2 |
| R1 | B2 | R3 | B4 | R1 | B2 |
| B1 | R2 | B3 | R4 | B1 | R2 |
| R1 | B2 | R3 | B4 | R1 | B2 |

FIG. 17C

| B1 | R1 | B2 | R2 | B3 | R3 |
|----|----|----|----|----|----|
| R1 | B1 | R2 | B2 | R3 | B3 |
| B4 | R4 | B1 | R1 | B2 | R2 |
| R4 | B4 | R1 | B1 | R2 | B2 |
| B3 | R3 | B4 | R4 | B1 | R1 |
| R3 | B3 | R4 | B4 | R1 | B1 |

FIG. 17D

| B1 | R1 | B2 | R2 | B3 | R3 |
|----|----|----|----|----|----|
| R4 | B1 | R1 | B2 | R2 | B3 |
| B4 | R4 | B1 | R1 | B2 | R2 |
| R3 | B4 | R4 | B1 | R1 | B2 |
| B3 | R3 | B4 | R4 | B1 | R1 |
| R2 | B3 | R3 | B4 | R4 | B1 |

FIG. 17E

| B3 | R3 | B2 | R2 | B1 | R1 |
|----|----|----|----|----|----|
| R3 | B2 | R2 | B1 | R1 | B4 |
| B2 | R2 | B1 | R1 | B4 | R4 |
| R2 | B1 | R1 | B4 | R4 | B3 |
| B1 | R1 | B4 | R4 | B3 | R3 |
| R1 | B4 | R4 | B3 | R3 | B2 |

FIG. 17F

| B1 | R1 | B1 | R1 | B2 | R2 |
|----|----|----|----|----|----|
| R1 | B1 | R1 | B1 | R2 | B2 |
| B1 | R1 | B1 | R1 | B2 | R2 |
| R1 | B1 | R1 | B1 | R2 | B2 |
| B4 | R4 | B4 | R4 | B1 | R1 |
| R4 | B4 | R4 | B4 | R1 | B1 |

FIG. 19

| | B1 | B2 | B3 | B4 |
|---|---|---|---|---|
| B | | | | |
| | B5 | B6 | B7 | B8 |
| | | | | |
| | R1 | R2 | R3 | R4 |
| R | | | | |
| | R5 | R6 | R7 | R8 |
| | | | | |
| | G1 | G2 | G3 | G4 |
| G | | | | |
| | G5 | G6 | G7 | G8 |
| | | | | |

DRd  DR2  DRc

DR1

551c-4
551b-4
551a-4

DISPLAY DEVICE AND ELECTRONIC DEVICE HAVING THE SAME

CROSS-REFERENCE TO RELATED APPLICATION(S)

This application claims priority to and benefits of Korean Patent Application No. 10-2022-0093214 under 35 U.S.C. § 119, filed in the Korean Intellectual Property Office on Jul. 27, 2022, the entire contents of which are incorporated herein by reference.

BACKGROUND

1. Technical Field

Embodiments relate to a display device and an electronic device including the same, and, to a display device having improved transmittance and a small difference in display quality depending on an azimuth angle, and an electronic device including the same.

2. Description of the Related Art

A display device serves to display a screen, and may include a liquid crystal display, an organic light emitting diode display, and the like. Such a display device is used in various electronic devices such as mobile phones, navigation units, digital cameras, electronic books, portable game machines, and various terminals.

A display device such as an organic light emitting diode display may have a structure in which the display device can be bent or folded using a flexible substrate.

In a small electronic device such as a mobile phone, an optical element such as a camera and an optical sensor are formed in a bezel area, which is a periphery of a display area, but a technique capable of positioning a camera or an optical sensor on a rear surface of the display area while increasing a size of a displayed screen and gradually decreasing a size of a surrounding area of the display area is reduced is being developed.

The above information disclosed in this background section is only for enhancement of understanding of the background of the described technology, and therefore, it may contain information that does not form the prior art that may already be known to a person of ordinary skill in the art.

SUMMARY

Embodiments have been made in an effort to provide a display device capable of improving light output efficiency and display quality.

Embodiments have been described in an effort to provide a display device having improved transmittance and a small difference in display quality depending on an azimuth angle.

An embodiment provides a display device that may include pixel electrodes disposed on a substrate; a pixel defining layer disposed on the pixel electrodes that include pixel openings overlapping the pixel electrodes in a plan view, respectively; an encapsulation layer disposed on the pixel electrodes and the pixel defining layer; a sensing electrode disposed on the encapsulation layer; a first insulating layer disposed on the sensing electrode that has openings overlapping the pixel openings in a plan view, respectively; and a second insulating layer disposed on the first insulating layer that has a higher refractive index than a refractive index of the first insulating layer, wherein each of the openings of the first insulating layer may include at least one protruding extension, and protruding directions of the at least one protruding extension formed in each of the openings include at least eight directions.

The at least eight directions may include a substantially cross-shaped direction and a substantially x-shaped direction.

Each of the openings of the first insulating layer may have four extensions, each of the openings may include a first opening and a second opening, the four extensions of the first opening may protrude in the substantially cross-shaped direction, and the four extensions of the second opening may protrude in the substantially x-shaped direction.

Each of the openings of the first insulating layer may have two extensions, and four of the openings may have eight directions.

Each of the openings the first insulating layer may have one extension, and eight of the openings may have eight directions.

The extension protruding from each of the openings may include a first extension disposed at a portion where two edges of each of the openings meet and extend in different directions.

The extension protruding from each of the openings may further include a second extension disposed at a central portion of an edge of each of the openings of the first insulating layer.

A length of the second extension may be substantially equal to or less than a length of the first extension.

The first extension may include a first subextension and a second subextension extending in a direction parallel to a first direction; and a third subextension and a fourth subextension extending in a direction parallel to a second direction different from the first direction, an imaginary first line overlapping the first subextension in a plan view and parallel to the first direction and an imaginary second line overlapping the second subextension in a plan view and parallel to the first direction may not overlap, and a third imaginary line overlapping the third subextension in a plan view and parallel to the second direction and a fourth imaginary line overlapping the fourth subextension in a plan view and parallel to the second direction may not overlap.

A length of the extension protruding from each of the openings may be greater than a width of the extension protruding from each of the openings, the width of the extension may be greater than about 0 μm and less than about 4 μm, and the width of the extension may decrease away from an edge of each of the openings of the first insulating layer.

A thickness of the second insulating layer may be about 9 μm or more and about 11 μm or less.

The pixel opening may include edges extending in different directions, and the pixel opening may have a substantially polygonal planar shape including at least one substantially chamfered edge.

Each of the openings of the first insulating layer may be larger than the pixel opening on a plane parallel to a surface of the substrate, and an edge of each of the openings of the first insulating layer may be disposed outside of an edge of the pixel opening.

A portion of at least one of the protruding extensions may overlap a portion of the sensing electrode in a plan view.

The portion of at least one of the protruding extensions overlapping the portion of the sensing electrode in a plan view may be an end of the extension.

An embodiment provides an electronic device that may include a housing including a rear surface and a side surface;

3 a cover window disposed at an upper portion of the housing; and a display panel disposed at a lower portion of the cover window to include a display area, the display panel may include pixel electrodes disposed on a substrate; a pixel defining layer disposed on the pixel electrodes including pixel openings overlapping the pixel electrodes in a plan view, respectively; an encapsulation layer disposed on the pixel electrodes and the pixel defining layer; a sensing electrode disposed on the encapsulation layer; a first insulating layer disposed on the sensing electrode including openings overlapping the pixel openings in a plan view, respectively; and a second insulating layer disposed on the first insulating layer that has a higher refractive index than a refractive index of the first insulating layer, wherein each of the openings of the first insulating layer may include at least one protruding extension, and protruding directions of the at least one protruding extension formed in each of the openings include at least eight directions.

The at least eight directions may include a substantially cross-shaped direction and a substantially x-shaped direction.

The at least one protruding extension protruding from the openings of the first insulating layer may include a first extension disposed where two edges of the openings meet and extend extending in different directions.

The extension protruding from the openings may include a second extension disposed at a central portion of an edge of the each of the openings of the first insulating layer.

A portion of at least one of the extensions may overlap a portion of the sensing electrode in a plan view.

According to embodiments, light emitting efficiency of the display device may be improved by forming an insulating layer having a difference in refractive index on the light emitting layer to transmit light to a front surface thereof.

According to embodiments, the opening of the first insulating layer having a low refractive index may have an extension, the second insulating layer having a high refractive index may be disposed in the opening and the extension, and a change in the display quality depending on the azimuth angle may not occur or may occur slightly, whereby the display quality may be set to a certain level or higher regardless of the azimuth angle.

BRIEF DESCRIPTION OF THE DRAWINGS

The above and other aspects and features of the disclosure will become more apparent by describing in detail embodiments thereof with reference to the attached drawings, in which.

4

Figure 8:
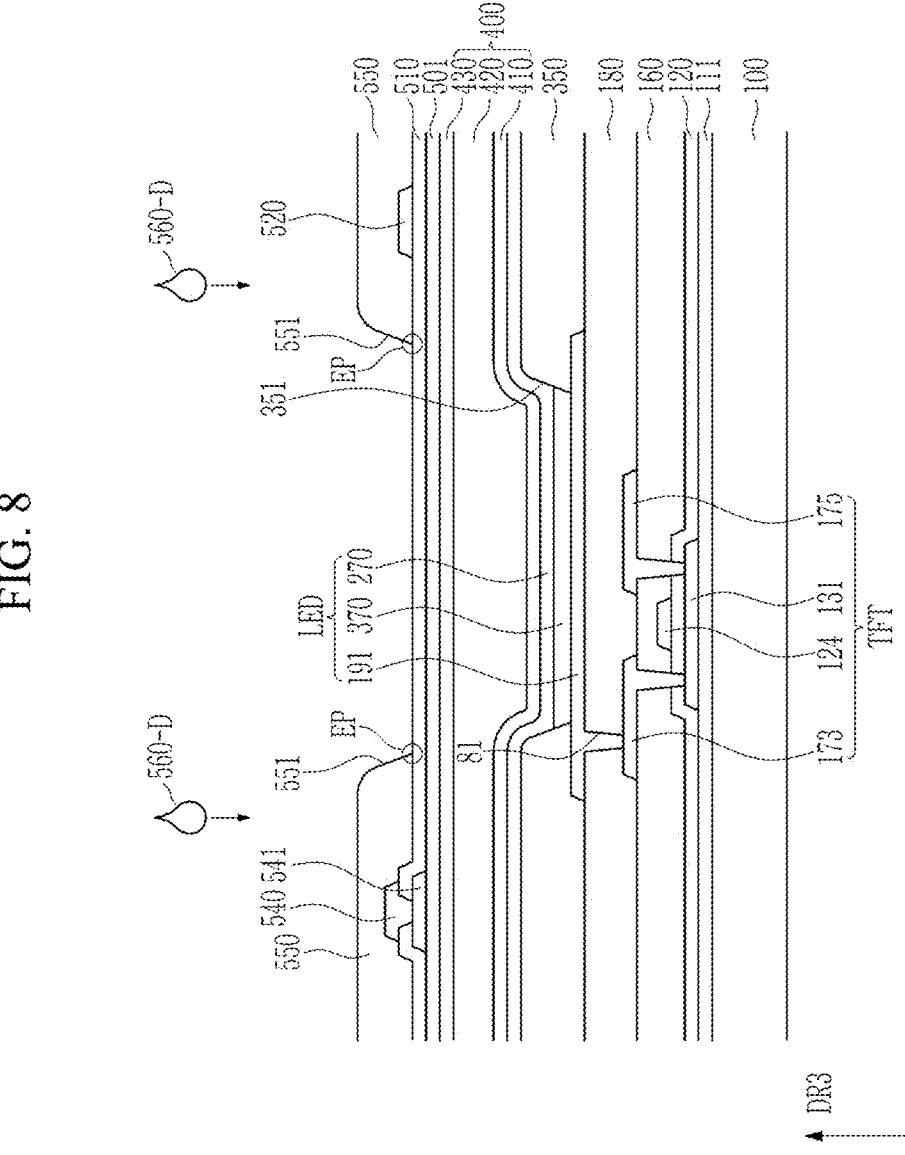

FIG. 8 illustrates a schematic cross-sectional view showing a step in a manufacturing process of a display device according to an embodiment.

Figure 9:
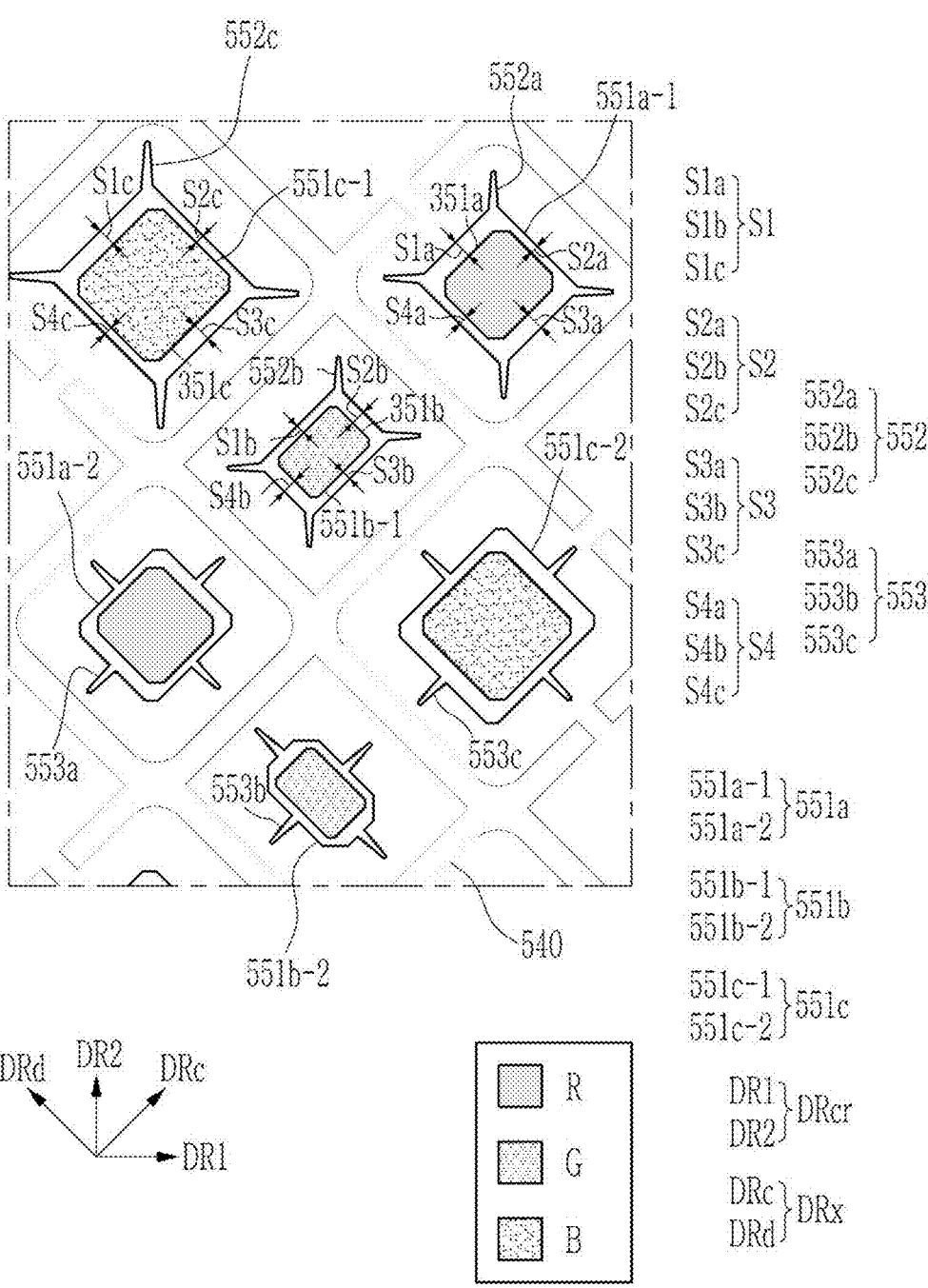

FIG. 9 illustrates a schematic top plan view showing a portion of a display area in a display device according to an embodiment.

Figure 10:
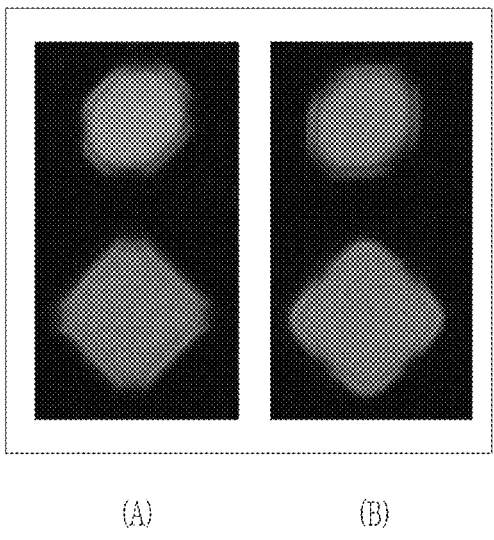

FIG. 10 illustrates a display characteristic depending on a position of an extension.

Figure 11:
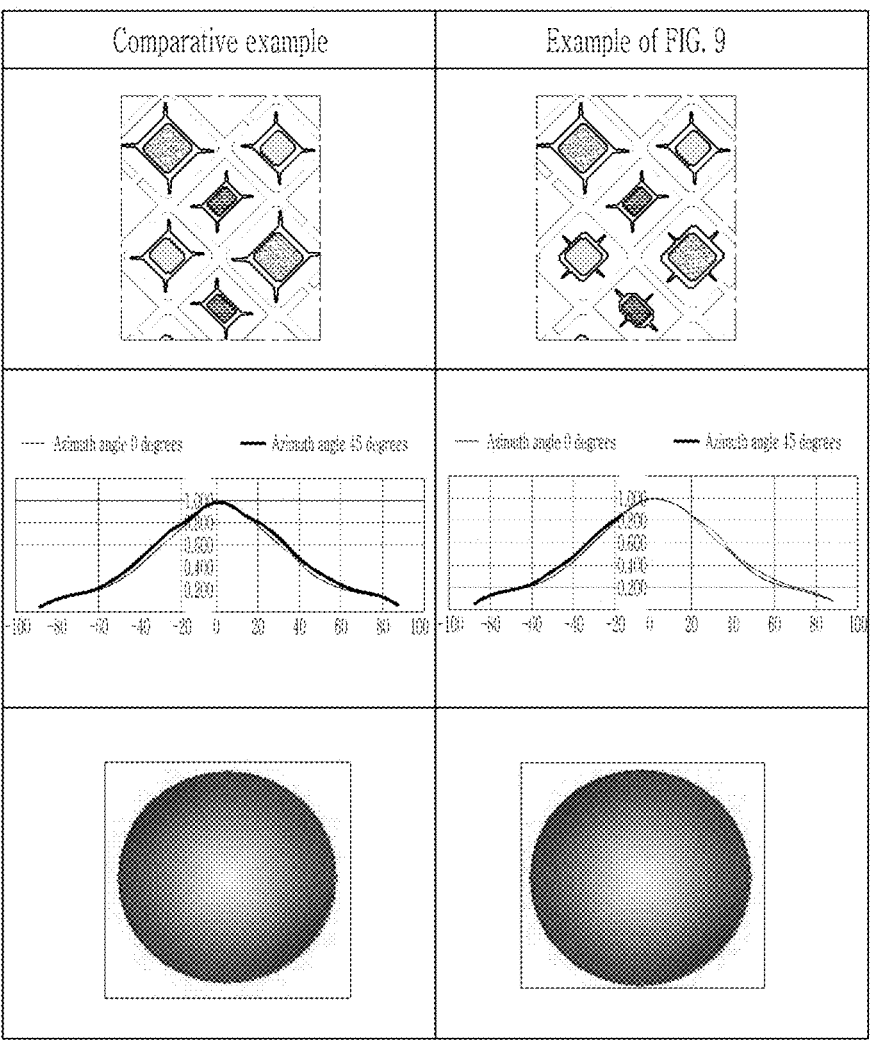

FIG. 11 illustrates a comparison of a difference in display characteristics between an example and a comparative example.

Figure 12:
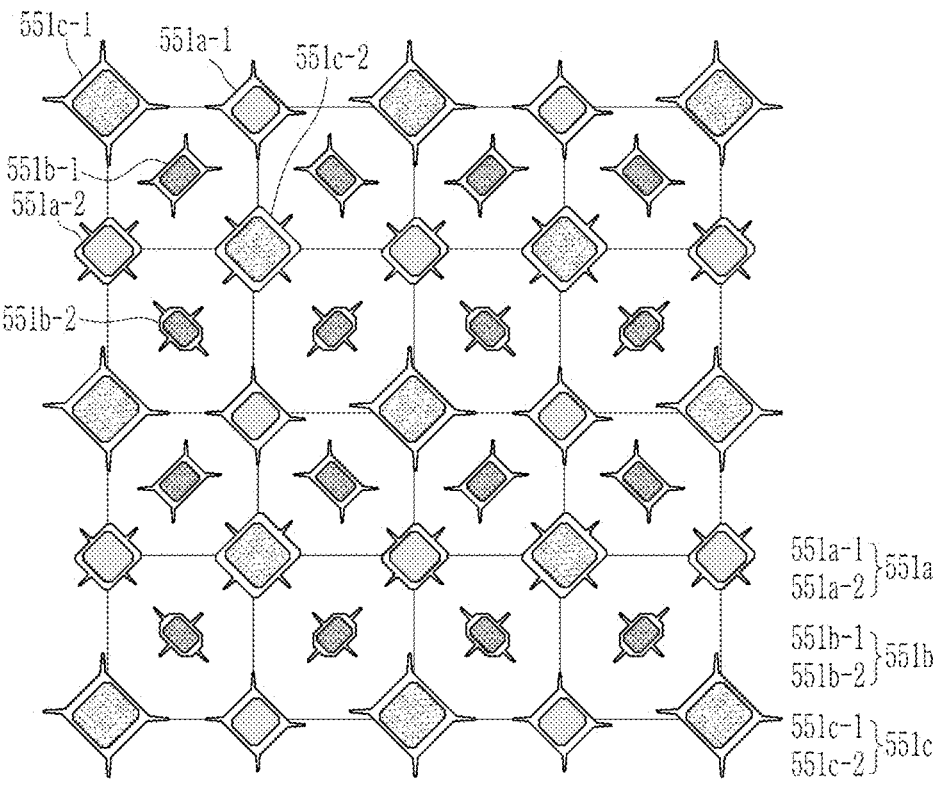
Figure 12:
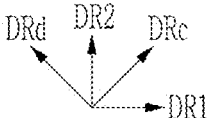

FIG. 12 illustrates a schematic top plan view showing a portion of a display area in a display device according to an embodiment.

Figure 13:
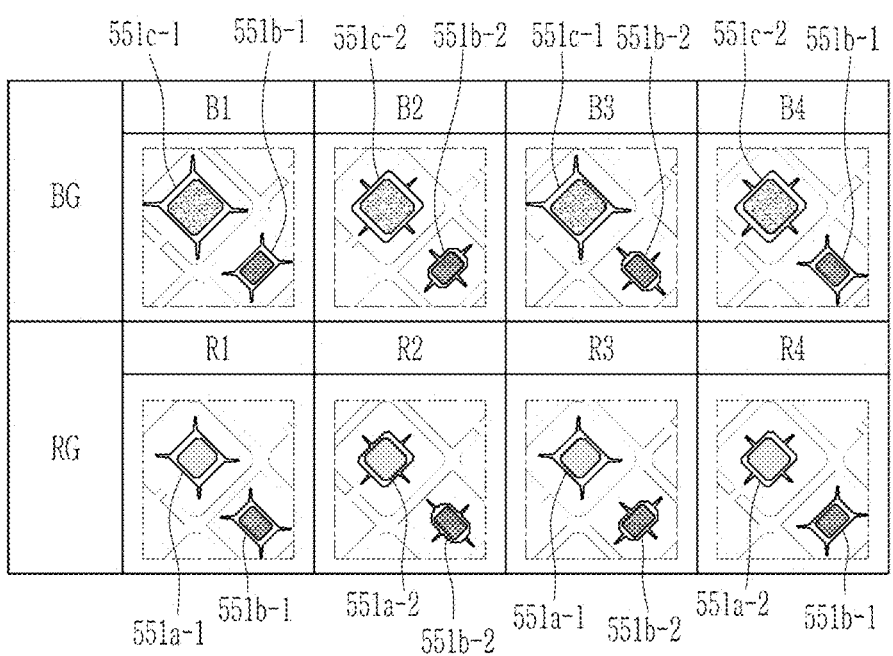
Figure 13:
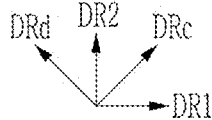

FIG. 13 illustrates various embodiments depending on positions of an extension in a display device according to an embodiment.

FIGS. 14A-14F to FIGS. 17A-17F each illustrate a schematic top plan view showing a portion of a display area in a display device according to an embodiment.

Figure 18:
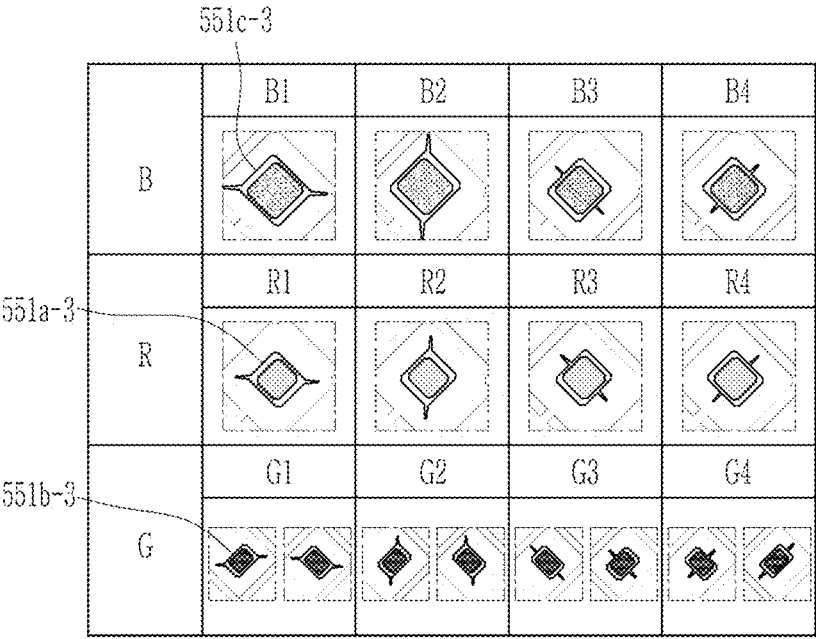
Figure 18:
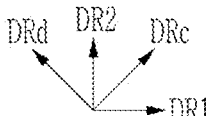

FIG. 18 illustrates various embodiments depending on positions of an extension in a display device according to an embodiment.

Figure 19:
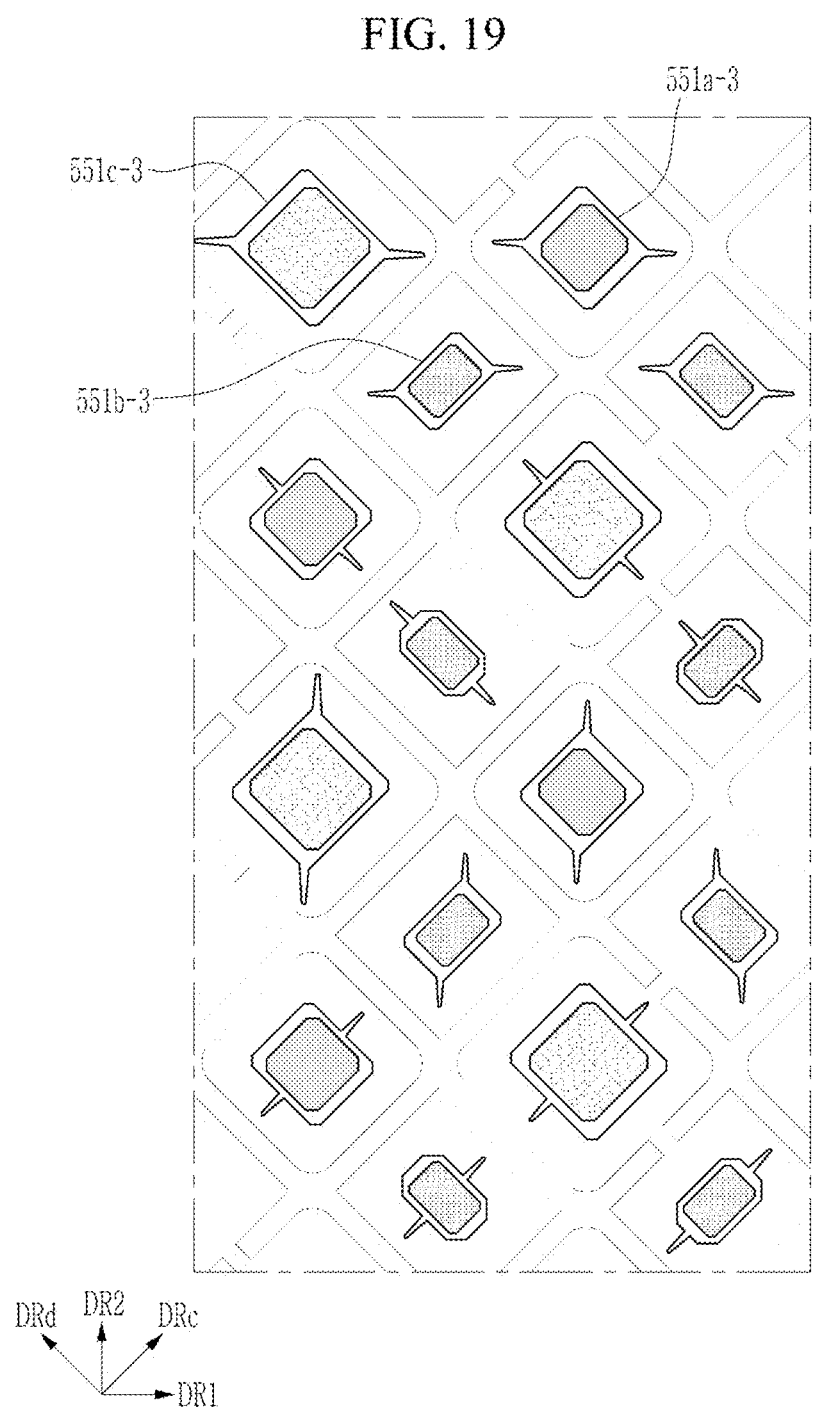
Figure 20:
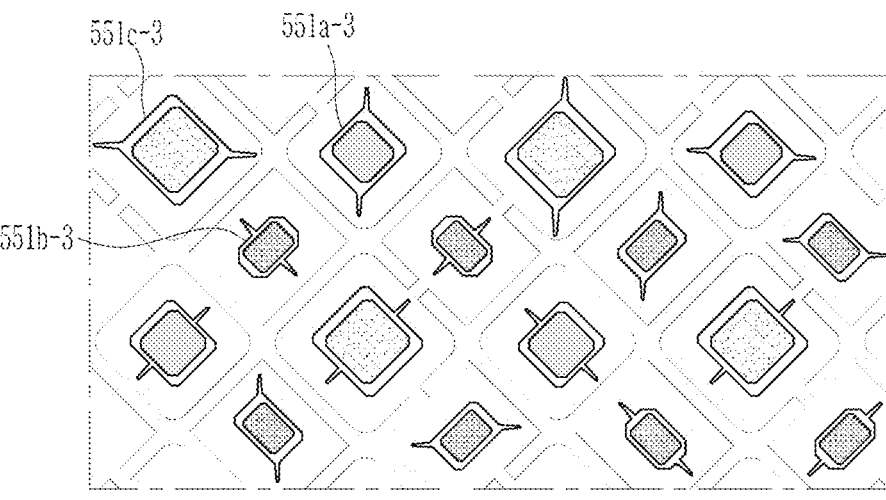
Figure 20:
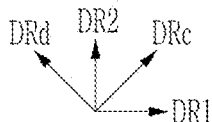

FIG. 19 and FIG. 20 each illustrate a schematic top plan view showing a portion of a display area in a display device according to an embodiment.

Figure 21:
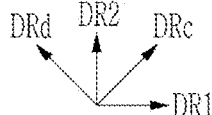

FIG. 21 illustrates various embodiments depending on positions of an extension in a display device according to an embodiment.

Figure 22:
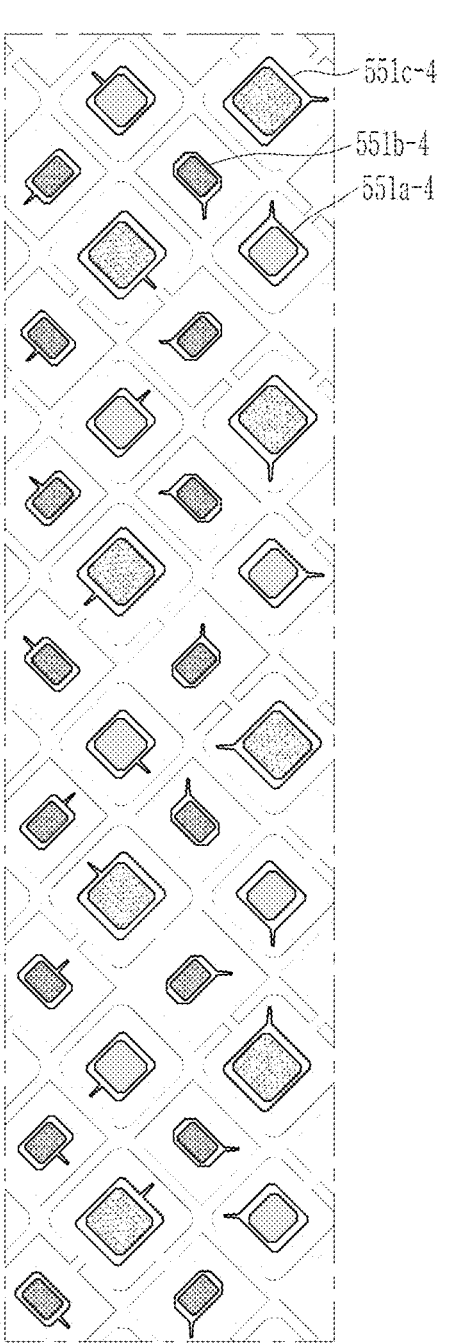
Figure 22:
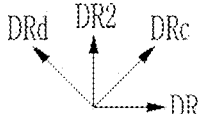

FIG. 22 illustrates a schematic top plan view showing a portion of a display area in a display device according to an embodiment.

Figure 23:
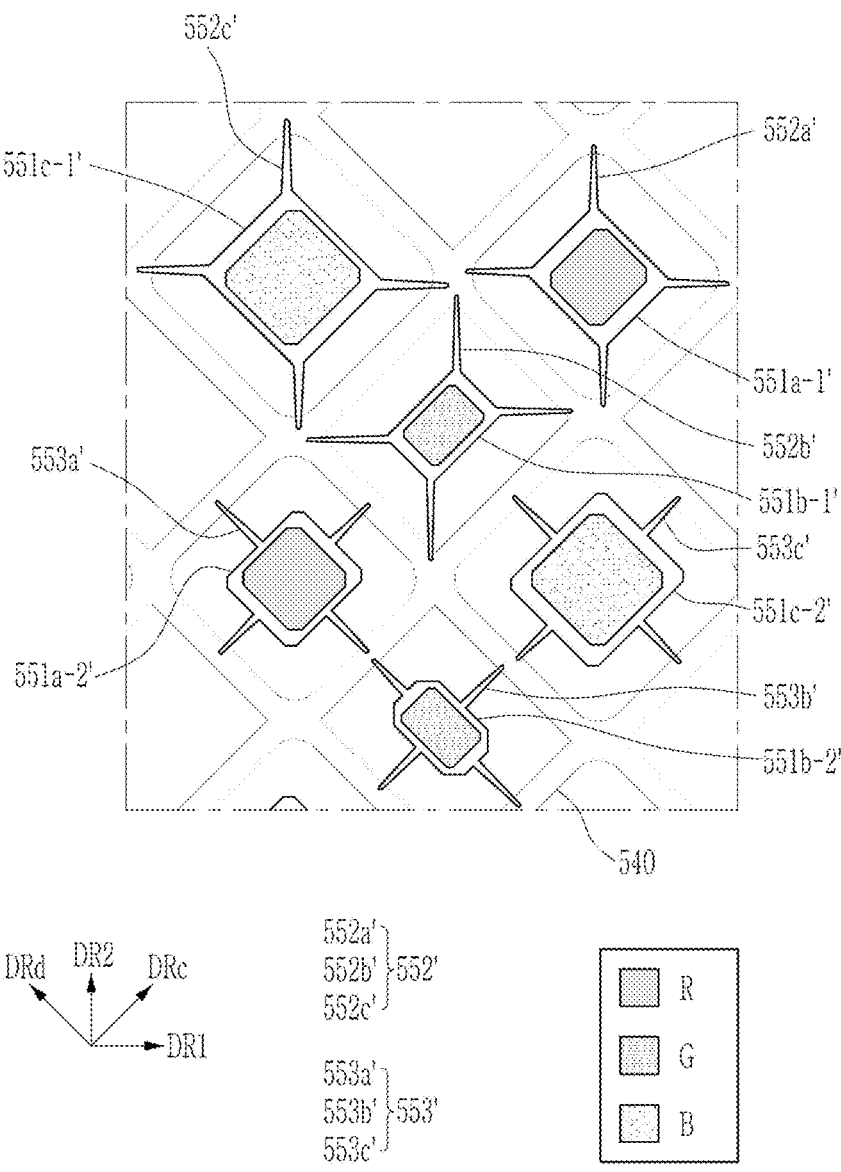

FIG. 23 illustrates a schematic top plan view showing a modification of FIG. 9.

DETAILED DESCRIPTION OF THE EMBODIMENTS

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

To clearly describe the disclosure, parts that may be irrelevant to the description may be omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, throughout the specification, the phrase "in a plan view" means when an object portion is viewed from above, and the phrase "in a cross-sectional view" means when a cross-section taken by vertically cutting an object portion is viewed from the side.

In addition, in the specification, "connected" (or coupled) means that two or more components are not only directly connected, but two or more components may be connected indirectly through other components, physically connected as well as being electrically connected, or it may be referred to by different names depending on the location or function, but may include connecting each of parts that are substantially integral to each other.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure. The shapes and structures also include shapes and structures substantial to those shapes and structures disclosed herein.

An electronic device (for example, a mobile phone, TV, monitor, notebook computer, etc.) including a display device, a display panel, etc. described in the specification, or an electronic device including a display device and a display panel manufactured by the manufacturing method described in the specification, are not excluded from the scope of the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

Hereinafter, various embodiments and modifications will be described in detail with reference to drawings.

Hereinafter, a schematic structure of a display device will be described in detail with reference to FIG. 1 to FIG. 3.

Figure 1:
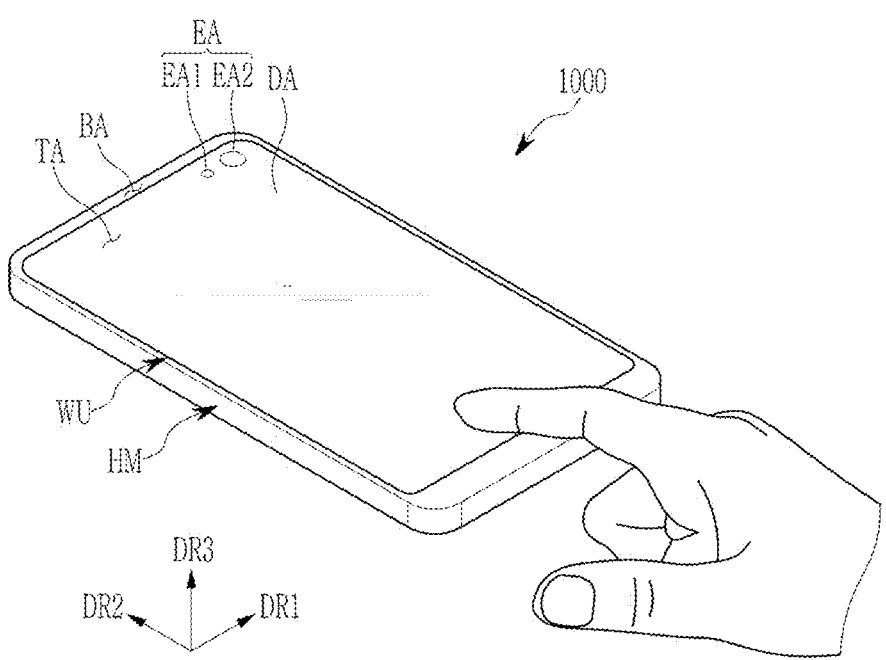
FIG. 1 illustrates a schematic perspective view showing a use state of a display device according to an embodiment.
Figure 2:
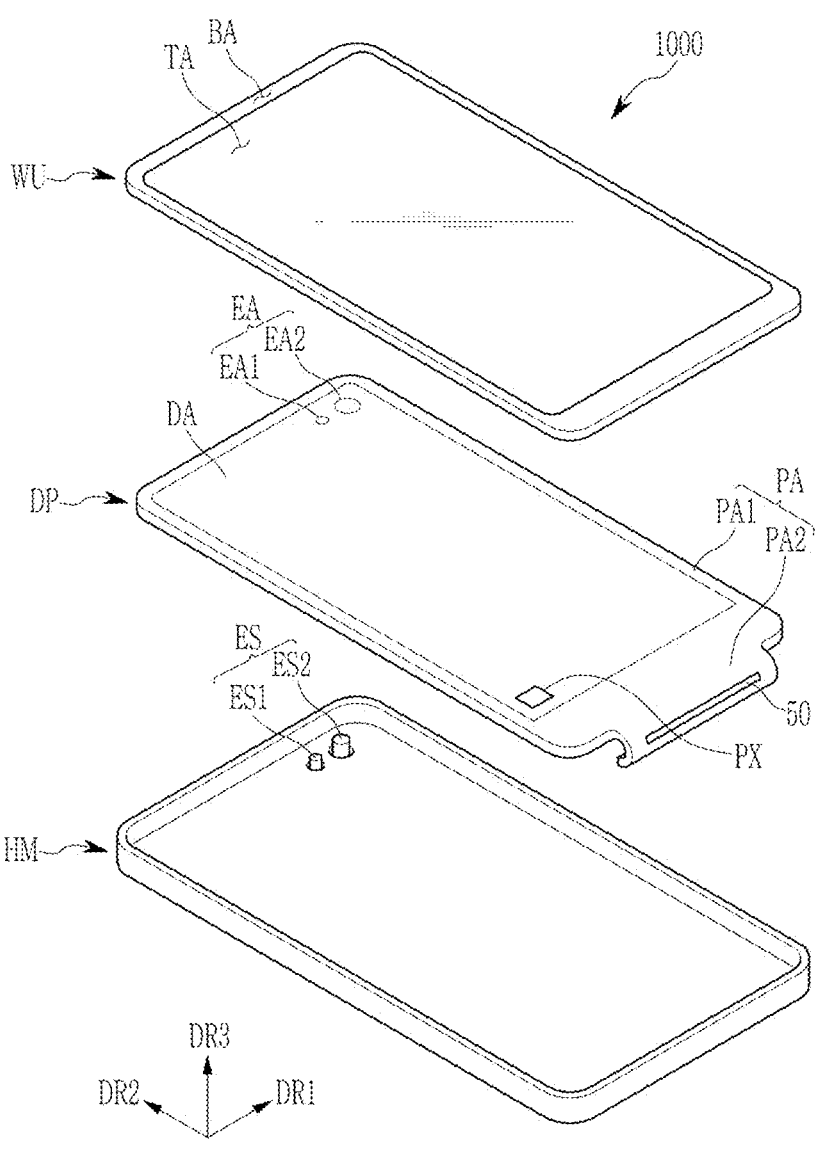
FIG. 2 illustrates an exploded perspective view of a display device according to an embodiment.
Figure 3:
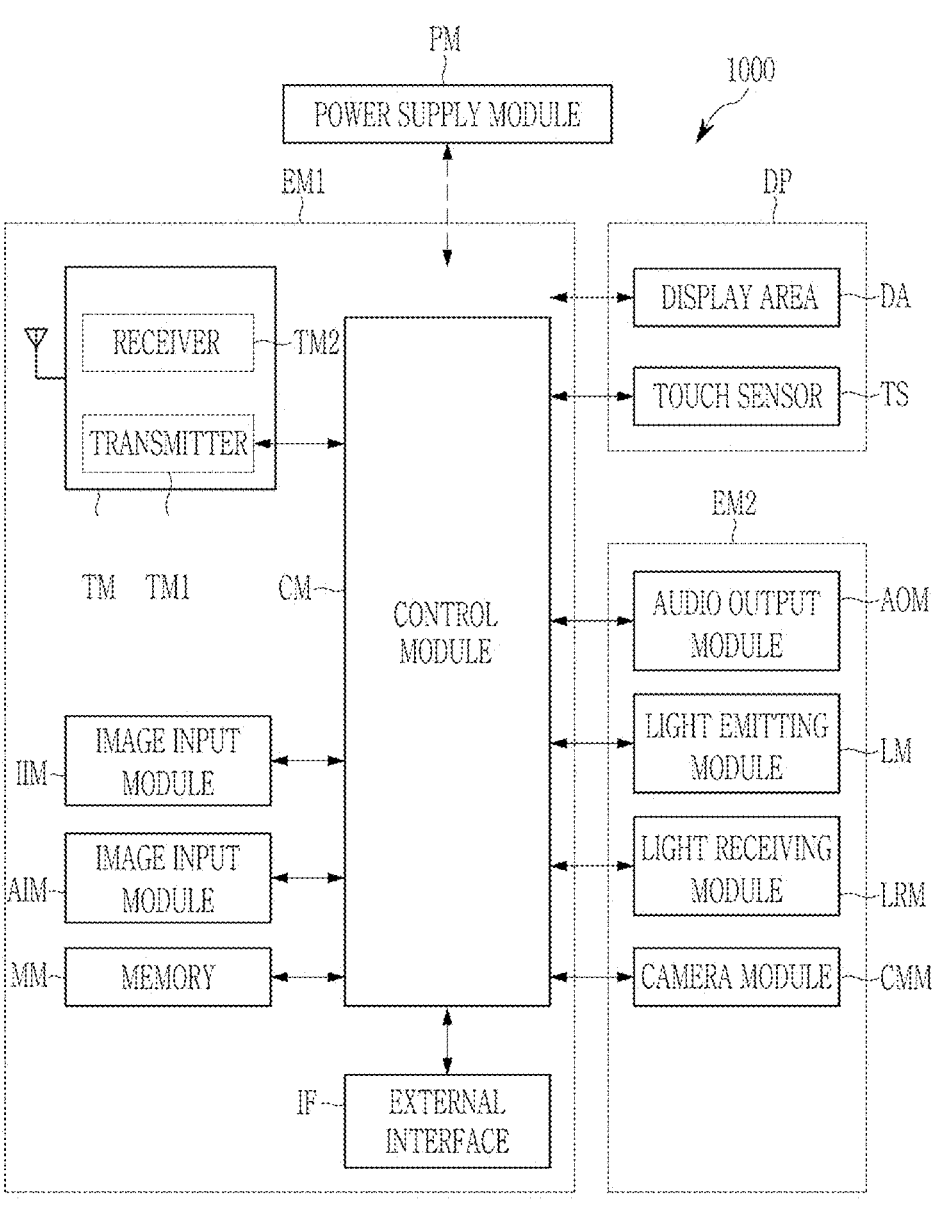
FIG. 3 illustrates a block diagram of a display device according to an embodiment.

FIG. 1 illustrates a schematic perspective view showing a use state of a display device according to an embodiment, FIG. 2 illustrates an exploded perspective view of a display device according to an embodiment, and FIG. 3 illustrates a block diagram of a display device according to an embodiment.

Referring to FIG. 1, the display device 1000 according to an embodiment, which is a device for displaying a moving image or a still image, may be used as a display screen of various products, such as a television, a laptop computer, a monitor, a billboard, the Internet of things (IOT), etc., as well as portable electronic devices such as a mobile phone, a smart phone, a tablet personal computer, a mobile communication terminal, an electronic notebook, an e-book, a portable multimedia player (PMP), a navigation system, and an ultra mobile PC (UMPC). The display device 1000 according to an embodiment may be used in a wearable device such as a smart watch, a watch phone, a glasses display, or a head mounted display (HMD). The display device 1000 according to an embodiment may be used as an instrument panel of a vehicle, a center information display (CID) provided at a center fascia or dashboard of a vehicle, a room mirror display that replaces a side mirror of a vehicle, or a display provided on a back surface of a front seat of a vehicle. FIG. 1 illustrates that the display device 1000 is used as a smart phone for convenience of description.

The display device 100 may display an image in a third direction DR3 on a display surface parallel to each of a first direction DR1 and a second direction DR2. A display surface on which an image is displayed may correspond to a front surface of the display device 1000, and may correspond to a front surface of a cover window WU. The image may include a still image as well as a dynamic image.

In an embodiment, a front surface (or upper surface) and a rear surface (or lower surface) of each member are defined based on a direction in which the image is displayed. The front and rear surfaces may be opposite to each other in the third direction DR3, and a normal direction of each of the front and rear surfaces may be parallel to the third direction DR3. A distance between the front surface and the rear surface in the third direction DR3 may correspond to a thickness of the display panel in the third direction DR3.

The display device 1000 according to an embodiment may sense a user input (refer to a hand of FIG. 1) applied from the outside. The user input may include various types of external inputs, such as a part of a user's body, light, heat, or pressure. In an embodiment, the user input is illustrated as a user hand applied to the front surface. However, the disclosure is not limited thereto. The user input may be provided in various forms. The display device 1000 may sense the user input applied to the side surface or the rear surface of the display device 1000 depending on a structure of the display device 1000.

Referring to FIG. 1 and FIG. 2, the display device 1000 may include a cover window WU, a housing HM, a display panel DP, and an optical element ES. In an embodiment, the cover window WU and the housing HM may be combined to form an outer appearance of the display device 1000.

The cover window WU may include an insulating panel. For example, the cover window WU may be formed of glass, plastic, or a combination thereof.

A front surface of the cover window WU may define a front surface of the display device 1000. A transmissive area TA may be an optically transparent area. For example, the transmissive area TA may be an area having visible ray transmittance of about 90% or more.

A blocking area BA defines a shape of the transmissive area TA. The blocking area BA may be adjacent to the transmissive area TA, to surround the transmissive area TA. The blocking area BA may be an area having relatively low light transmittance compared to the transmissive area TA. The blocking area BA may include an opaque material that blocks light. The blocking area BA may have a color. The blocking area BA may be defined by a bezel layer provided separately from a transparent substrate defining the transmissive area TA, or may be defined by an ink layer formed by being inserted or colored in a transparent substrate.

The display panel DP may include a front surface including a display area DA and a non-display area PA. The display area DA may be an area in which a pixel operates depending on an electrical signal to emit light. The non-display area PA of the display panel DP may include a driver 50.

In an embodiment, the display area DA is an area in which an image is displayed by including pixels, and at the same time, may be an area where a touch sensor is positioned (or disposed) above the pixel in the third direction DR3 to sense an external input.

A transmissive area TA of the cover window WU may at least partially overlap the display area DA of the display panel DP. For example, the transmissive area TA may overlap an entire surface of the display area DA, or may overlap at least a portion of the display area DA. Accordingly, a user may view an image through the transmission area TA, or may provide an external input based on the image. However, the disclosure is not limited thereto. For example, an area in which an image is displayed and an area in which the external input is sensed may be separated from each other in the display area DA.

The non-display area PA of the display panel DP may at least partially overlap a blocking area BA of the cover window WU. The non-display area PA may be an area covered by a blocking area BA. The non-display area PA may be adjacent to the display area DA, and may surround the display area DA. An image is not displayed in the non-display area PA, and a driving circuit, a driving wire, and the like for driving the display area DA may be positioned. The non-display area PA may include a first peripheral area PA1 in which the display area DA is positioned outside and a second peripheral area PA2 including a driver 50, and a connection wire, and a bending area. In an embodiment of FIG. 2, the first peripheral area PA1 is positioned at a third side of the display area DA, and the second peripheral area PA2 is positioned at a remaining side of the display area DA.

In an embodiment, the display panel DP may be assembled in a flat state in which the display area DA and the non-display area PA face the cover window WU. However, the disclosure is not limited thereto. A portion of the non-display area PA of the display panel DP may be bent. A portion of the non-display area PA faces the rear surface of the display device 1000, so that the blocking area BA shown on the front surface of the display device 1000 may be reduced, and in FIG. 2, the second peripheral area PA2 may be bent to be positioned on the rear surface of the display area DA, and assembled.

The display panel DP may include a component area EA, and by way of example, a first component area EA1 and a second component area EA2. The first component area EA1 and the second component area EA2 may be at least partially surrounded by the display area DA. Although the first component area EA1 and the second component area EA2 are illustrated as being spaced apart from each other, the disclosure is not limited thereto, and at least portions thereof may be connected. The first component area EA1 and the second component area EA2 may each be an area in which a component using infrared rays, visible light, or sound is positioned therebelow.

In the display area DA, light emitting diodes and pixel circuit units that generate and transfer emission currents to the respective light emitting diodes are formed. Herein, one light emitting diode and one pixel circuit unit are referred to as a pixel PX. In the display area DA, one pixel circuit unit and one light emitting diode are formed on a one-to-one basis.

The first component area EA1 may include a transmissive portion through which light and/or sound may pass and a display unit including pixels. The transmissive portion is positioned between adjacent pixels and is formed to include a layer through which light and/or sound can pass. The transmissive portion may be positioned between adjacent pixels, and a layer through which light is not transmitted, such as a light blocking layer, may overlap the first component area EA1. A number of pixels per unit area of pixels (hereinafter also referred to as normal pixels) included in the display area DA (hereinafter referred to as resolution) and a number of pixels per unit area of pixels (hereinafter also referred to as first component pixels) included in the first component area EA1 may be the same.

The second component area EA2 may include an area (hereinafter also referred to as a light transmitting area) including a transparent layer to allow light to pass therethrough, no conductive layer or semiconductor layer may be positioned in the light transmitting area, and the light transmitting area may have a structure that does not block light by having an opening that overlaps a position where a layer including a light blocking material, for example, a pixel defining layer and/or a light blocking layer corresponds to the second component area EA2. A number of pixels per unit area of the pixels (hereinafter also referred to as second component pixels) included in the second component area EA2 may be smaller than a number of pixels per unit area of the normal pixels included in the display area DA. As a result, resolution of the second component pixels may be lower than that of the normal pixels.

Referring to FIG. 1, FIG. 2, and FIG. 3, the display panel DP may include the display area DA including display pixels and a touch sensor TS. The display panel DP may be visually recognized by a user from the outside through the transmissive area TA, including pixels that generate an image. The touch sensor TS may be positioned above the pixels, and may sense an external input applied from the outside. The touch sensor TS may sense the external input provided to the cover window WU.

Again, referring to FIG. 2, a second peripheral area PA2 may include a bending portion. The display area DA and the first peripheral area PA1 may have a flat state that is substantially parallel to a plane defined by the first direction DR1 and the second direction DR2, and a first side of the second peripheral area PA2 may extend from the flat state and have the flat state again after going through a bending portion. At least a portion of the second peripheral area PA2 may be bent and assembled to be positioned on a back side of the display area DA. At least a portion of the second peripheral area PA2 overlaps the display area DA in a plan view in case that assembled, so that the blocking area BA of the display device 1000 may be reduced. However, the disclosure is not limited thereto. For example, the second peripheral area PA2 may not be bent.

The driver 50 may be mounted on the second peripheral area PA2, and may be mounted on the bending portion or positioned at one of opposite sides of the bending portion. The driver 50 may be provided in the form of a chip.

The driver 50 may be electrically connected to the display area DA to transmit an electrical signal to the display area DA. For example, the driver 50 may provide data signals to the pixels PX positioned in the display area DA. For example, the driver 50 may include a touch driving circuit, and may be electrically connected to the touch sensor TS positioned in the display area DA. The driver 50 may include various circuits in addition to the above-described circuits, or may be designed to provide various electrical signals to the display area DA.

The display device 1000 may include a pad portion positioned at an end of the second peripheral area PA2, and may be electrically connected to a flexible printed circuit board (FPCB) including a driving chip by means of a pad portion. Herein, the driving chip positioned on the flexible printed circuit board may include various driving circuits for driving the display device 1000, connectors for supplying power, etc., within the spirit and the scope of the disclosure. According to an embodiment, a rigid printed circuit board (PCB) may be used instead of the flexible printed circuit board.

An optical element ES may be positioned at a lower portion of the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor that receives and uses light, such as an infrared sensor, a sensor that outputs and detects light or sound to measure a distance or to recognize fingerprints, a small lamp that outputs light, a speaker that outputs sound, or the like within the spirit and the scope of the disclosure. In the case of an electronic element using light, light of various wavelength bands such as visible light, infrared light, and ultraviolet light may be used.

The second optical element ES2 may be at least one of a camera, an infrared camera, a dot projector, an infrared illuminator, or a time-of-flight sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, a display pixel and a touch sensor TS positioned in the display area DA among elements of the display panel DP are illustrated as an example.

The power supply module PM may supply power required for an overall operation of the display device 1000. The power supply module PM may include a given battery module.

The first electronic module EM1 and the second electronic module EM2 may include various functional modules for operating the display device 1000. The first electronic module EM1 may be directly mounted on a motherboard that is electrically connected to the display panel DP, or may be mounted on a separate board to be electrically connected to the motherboard through a connector (not illustrated).

The first electronic module EM1 may include a control module CM, a wireless communication module TM, an image input module IIM, an audio input module AIM, a memory MM, and an external interface IF. Some or a number of the modules may not be mounted to a motherboard, but may be electrically connected to the motherboard through a flexible printed circuit board connected thereto.

The control module CM may control the overall operation of the display device 1000. The control module CM may be a microprocessor. For example, the control module CM activates or deactivates the display panel DP. The control module CM may control other modules such as the image input module IIM and the audio input module AIM based on a touch signal received from the display panel DP.

The wireless communication module TM may transmit/ receive a wireless signal to/from another terminal using a Bluetooth or Wi-Fi line. The wireless communication module TM may transmit/receive a voice signal using a general communication line. The wireless communication module TM may include a transmitter TM1 that modulates and transmits a signal to be transmitted, and a receiver TM2 that demodulates the received signal.

The image input module IIM may process an image signal, and may convert it into image data that can be displayed on the display panel DP. The sound input module AIM may receive an external sound signal by a microphone in a recording mode, a voice recognition mode, and the like, and may convert it into electrical voice data.

The external interface IF may serve as an interface connected to an external charger, a wired/wireless data port, a card socket (for example, a memory card, a SIM/UIM card), and the like within the spirit and the scope of the disclosure.

The second electronic module EM2 may include an audio output module (AOM), a light emitting module (LM), a light receiving module (LRM), and a camera module (CMM), etc., and at least some or a number of them, which are optical elements ES, may be positioned on the rear surface of the display panel DP as illustrated in FIG. 1 and FIG. 2. The optical element ES may include a light emitting module LM, a light receiving module LRM, and a camera module CMM. The second electronic module EM2 may be mounted directly on the motherboard, may be mounted on a separate board, and may be electrically connected to the display panel DP through a connector (not illustrated) or the like, or may be electrically connected to the first electronic module EM1.

The sound output module AOM may convert sound data received from the wireless communication module TM or sound data stored in the memory MM to output the converted sound data to the outside.

The light emitting module LM may generate and output light. The light emitting module LM may output infrared rays. For example, the light emitting module LM may include an LED element. For example, the light receiving module LRM may sense infrared rays. The light receiving module LRM may be activated in case that infrared rays of a level or more are sensed. The light receiving module LRM may include a CMOS sensor. After infrared light generated by the light emitting module LM is outputted, it is reflected by an external subject (for example, a user's finger or face), and the reflected infrared light may be incident on the light receiving module LRM. The camera module CMM may capture an external image.

In an embodiment, the optical element ES may additionally include a photosensitive sensor or a thermal sensor. The optical element ES may sense an external object received through the front surface, or may supply a sound signal such as a voice through the front surface to the outside. The optical element ES may include components, but is not limited to any one embodiment.

Referring to FIG. 2 again, the housing HM may be connected or coupled to the cover window WU. The cover window WU may be positioned on the front surface of the housing HM. The housing HM may be connected or coupled to the cover window WU to provide an accommodation space. The display panel DP and the optical element ES may be accommodated in the accommodation space provided between the housing HM and the cover window WU.

The housing HM may include a material having relatively high rigidity. For example, the housing HM may include frames and/or plates made of glass, plastic, metal, or a combination thereof. The housing HM may stably protect components of the display device 1000 accommodated in an internal space from external impact.

Hereinafter, a display panel in a display device according to an embodiment will be described with reference to FIG. 4 and FIG. 5.

Figure 4:
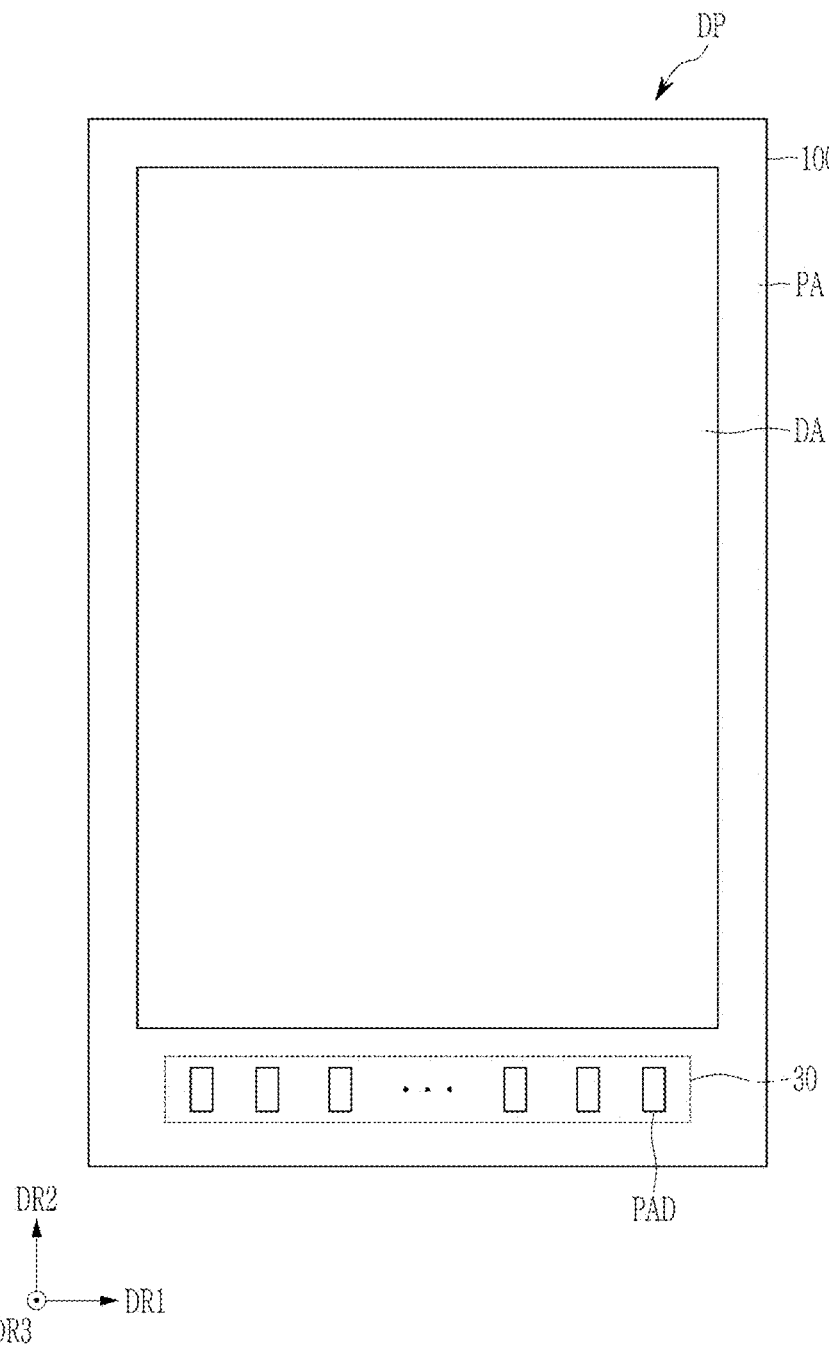
FIG. 4 illustrates a schematic top plan view of a portion of a display panel according to an embodiment.
Figure 5:
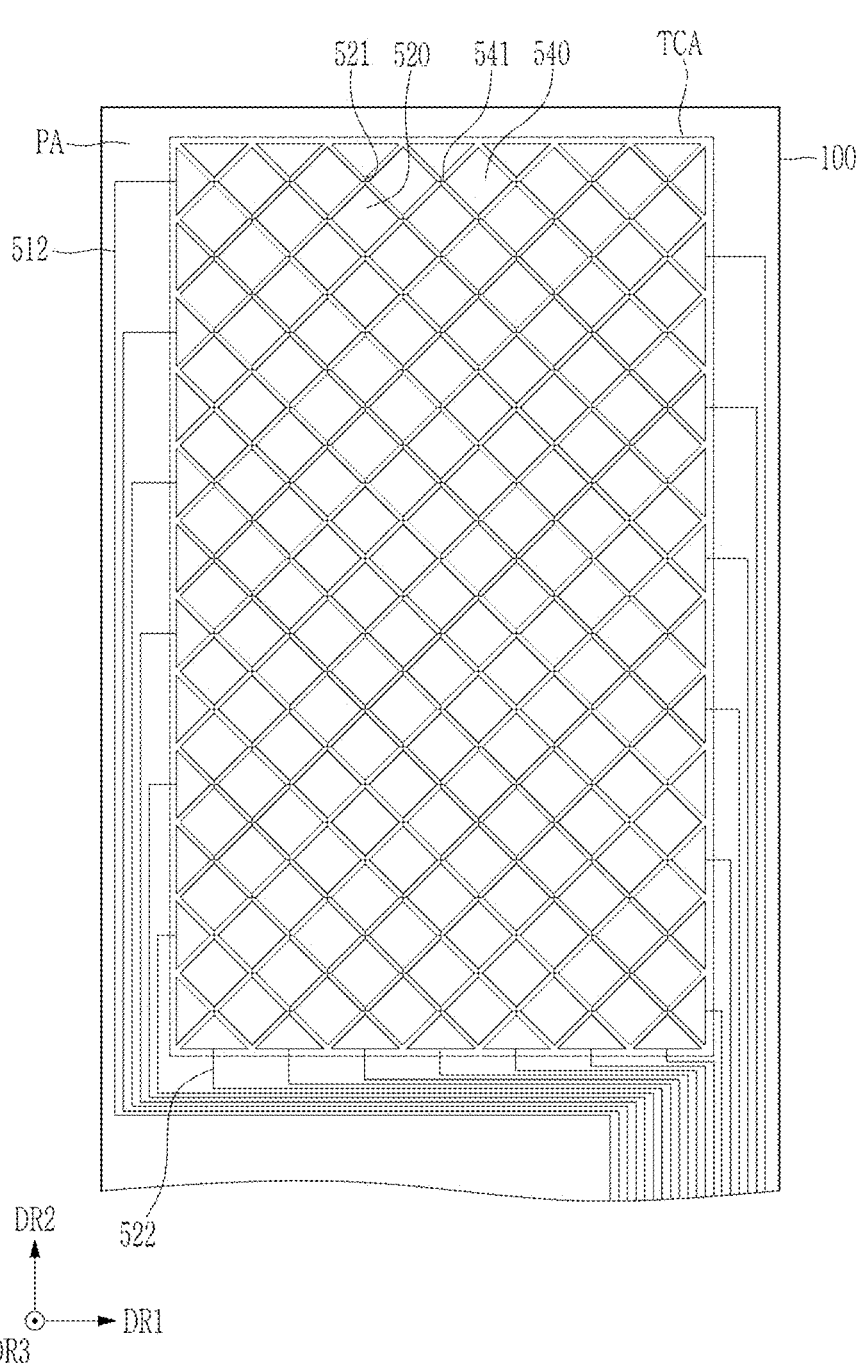
FIG. 5 illustrates a schematic top plan view of a sensing electrode in a display panel according to an embodiment.

FIG. 4 illustrates a schematic top plan view of a portion of a display panel according to an embodiment, and FIG. 5 illustrates a schematic top plan view of a sensing electrode in a display panel according to an embodiment.

Referring first to FIG. 4, the display panel DP of the display device 1000 according to an embodiment may include a substrate 100 and a pad portion 30.

The substrate 100 may be divided into a display area DA and a non-display area PA. The display area DA is an area in which light emitting diodes and pixel circuit units generating emission currents and transferring them to the respective light emitting diodes are formed to display an image, and the non-display area PA is an area in which an image is not displayed. The non-display area PA may be positioned to surround a periphery of the display area DA. The non-display area PA may include the pad portion 30 in which pads PAD for applying driving signals to pixels are formed.

A pixel circuit unit and a light emitting diode included in a pixel (not illustrated) positioned in the display area DA are formed in a one-to-one manner, the pixel circuit units may be arranged (or disposed) in a matrix form, and the light emitting diodes positioned thereon may be arranged in various forms.

Referring to FIG. 5, a sensing area TCA including sensing electrodes 520 and 540 may be positioned above the display area DA and above the light emitting diodes to recognize a touch. The sensing area TCA may be an area in which the touch sensor TS is positioned.

A signal line or voltage line (for example, a driving voltage line, a driving low voltage line, etc.) for transferring a signal or voltage to the pixel formed in the display area DA may be positioned in the non-display area PA, and the pad portion 30 connected to a signal line or a voltage line may be positioned. Sensing wires 512 and 522 may be further positioned in the non-display area PA. The sensing wires 512 and 522 may be connected to the sensing electrodes 520 and 540, and may be connected to some or a number of pads PAD of the pad portion 30.

The pad portion 30 is positioned in a portion of the non-display area PA, and may include pads PAD. Voltages, signals, etc. may be applied to voltage lines (not illustrated) connected to the display area DA through the pads PAD and the sensing wires 512 and 522. A flexible printed circuit board (FPCB) may be attached to the pad portion 30 of the non-display area PA, so that the flexible printed circuit board and the pad portion 30 may be electrically connected to each other. The FPCB and the pad portion 30 may be electrically connected by an anisotropic conductive film.

As illustrated in FIG. 5, the sensing area TCA may include the sensing electrodes 520 and 540. The sensing electrodes 520 and 540 may include first sensing electrodes 520 and second sensing electrodes 540 which are electrically separated.

According to an embodiment, the first sensing electrodes 520 may be sensing input electrodes, and the second sensing electrodes 540 may be sensing output electrodes. However, the disclosure is not limited thereto, and the first sensing electrodes 520 may be the sensing output electrodes, and the second sensing electrodes 540 may be the sensing input electrodes.

The first sensing electrodes 520 and the second sensing electrodes 540 may be distributed so as to not overlap each other in the sensing area TCA, and may be disposed in a mesh form. The first sensing electrodes 520 are arranged along a first one of a column direction and a row direction (refer to FIG. 5, the second direction DR2), and the first sensing electrodes 520 are electrically connected to each other by a first sensing electrode connector 521 (also referred to as a bridge). On the other hand, the second sensing electrodes 540 are also arranged along a second one of the column direction and the row direction (referring to FIG. 5, the first direction DR1), and the second sensing electrodes 540 are electrically connected to each other by a second sensing electrode connector 541.

The first sensing electrodes 520 and the second sensing electrodes 540 may be positioned on a same conductive layer. According to an embodiment, the first sensing electrodes 520 and the second sensing electrodes 540 may be positioned at different conductive layers. Referring to FIG. 5, the first sensing electrode 520 and the second sensing electrode 540 may have a rhombus shape, but the disclosure is not limited thereto, and may have a polygonal shape such as a square or a hexagon, or a circular shape or an oval shape according to an embodiment.

Referring to FIG. 5, the first sensing electrodes 520 and the second sensing electrodes 540 are illustrated as an integral structure of a rhombus, however, one rhombus structure may have an opening and may have a structure in which linear structures are arranged to have a mesh shape. The opening may correspond to a region where the light emitting diode emits light upward. According to an embodiment, it may have a shape that further may include a protrusion in order to improve sensitivity of a detection sensor.

The first sensing electrodes 520 and the second sensing electrodes 540 may be formed as a transparent conductor or an opaque conductor. For example, the first sensing electrodes 520 and the second sensing electrodes 540 may include a transparent conductive oxide (TCO), and the TCO may include at least one of an indium tin oxide (ITO), an indium zinc oxide (IZO), a zinc oxide (ZnO), a carbon nanotube (CNT), and graphene. The first sensing electrodes 520 and the second sensing electrodes 540 may have openings. The openings formed in the sensing electrodes 520 and 540 serve to allow light emitted from a light emitting diode to be emitted to the front without interference.

In case that the first sensing electrodes 520 and the second sensing electrodes 540 are positioned at a same layer, one of the first sensing electrode connector 521 and the second sensing electrode connector 541 may be positioned at the same layer as that of the first sensing electrodes 520 and the second sensing electrodes 540, and the other one may be positioned at a different layer from that of the first sensing electrodes 520 and the second sensing electrodes 540. As a result, the first sensing electrodes 520 and the second sensing electrodes 540 may be electrically separated. The sensing electrode connector disposed at the different layer may be disposed at an upper layer or a lower layer of the first sensing electrodes 520 and the second sensing electrodes 540, and in embodiments described below, descriptions will be made focusing on an embodiment in which the sensing electrode connector is disposed on the lower layer, for example, a layer closer to the substrate.

The sensing wires 512 and 522 are respectively connected to the first sensing electrodes 520 and the second sensing electrodes 540 in the non-display area PA. The first sensing wires 512 may be connected to the second sensing electrodes 540 positioned in the first direction DR1, and the second sensing wires 522 may be connected to the first sensing electrodes 520 positioned in the second direction DR2. According to an embodiment, the first sensing wire 512 and the second sensing wire 522 may be electrically connected some or a number of the pads PAD included in the pad portion 30 of FIG. 4.

In FIG. 5, a sensor of a mutual-cap type that senses a touch using two sensing electrodes 520 and 540 is illustrated. However, according to an embodiment, it may be formed as a sensor of a self-cap type that senses a touch using only one sensing electrode.

Hereinafter, a display device according to an embodiment will be further described with reference to FIG. 6, centering on a cross-sectional view in the display area DA.

Figure 6:
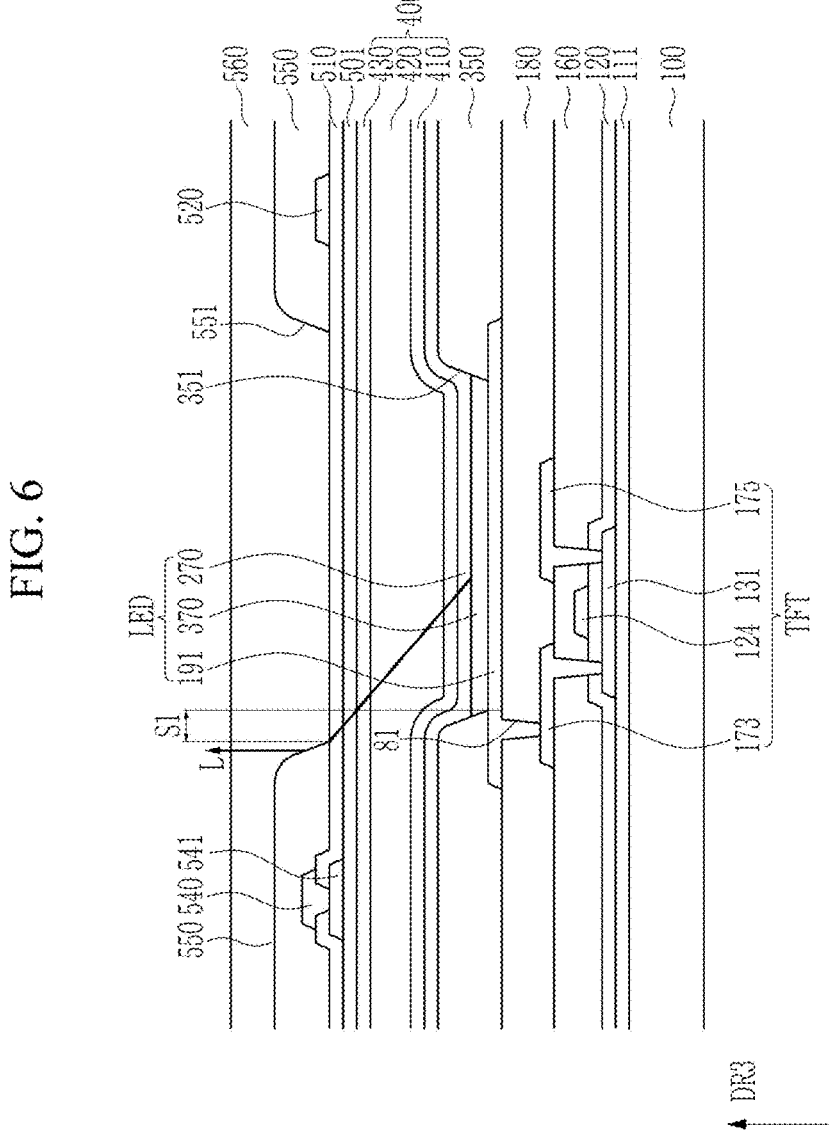
FIG. 6 illustrates schematic cross-sectional views showing a portion of a display area in a display device according to an embodiment.

FIG. 6 illustrates schematic cross-sectional views showing a portion of a display area in a display device according to an embodiment.

As illustrated in FIG. 6, the display device 1000 according to an embodiment may include a substrate 100 and a transistor TFT positioned on the substrate 100 and including a semiconductor 131, a gate electrode 124, a source electrode 173, and a drain electrode 175.

By way of example, the buffer layer 111 is positioned on the substrate 100, the semiconductor 131 is positioned on the buffer layer 111, the gate insulating layer 120 is positioned on the semiconductor 131, and the gate electrode 124 is positioned on the gate insulating layer 120. An interlayer insulating layer 160 is positioned on the gate electrode 124, the source electrode 173 and the drain electrode 175 are positioned on the interlayer insulating layer 160, and an organic layer 180 is positioned thereon. The source electrode 173 and the drain electrode 175 are respectively connected to portions (source region and drain region) of the semiconductor 131 through openings positioned in the gate insulating layer 120 and the interlayer insulating layer 160. A pixel electrode 191 is positioned on the organic layer 180, and a pixel defining layer 350 including a pixel opening 351 overlapping at least a portion of the pixel electrode 191 is positioned on the pixel electrode 191. An emission layer 370 is positioned in the pixel opening 351 of the pixel defining layer 350 and on the pixel electrode 191. A common electrode 270 is positioned on the pixel defining layer 350 and the emission layer 370, and an encapsulation layer 400 is positioned on the common electrode 270. Herein, the pixel electrode 191, the emission layer 370, and the common electrode 270 may constitute the light emitting diode LED.

A lower sensing insulating layer 501, the first sensing insulating layer 510, the sensing electrodes 520 and 540, and a sensing electrode connector 541 may be provided on the encapsulation layer 400 for touch sensing. The display device may further include a first insulating layer 550 and a second insulating layer 560 positioned above the sensing area TCA.

The structure of FIG. 6 described above will be described in detail as follows.

The substrate 100 may include a material having a rigid characteristic such as glass, or a flexible material such as plastic or polyimide that is bendable. A buffer layer 111 for flattening a surface of the substrate 100 and blocking penetration of impurity elements may be further positioned on the substrate 100. The barrier layer 111 may include an inorganic material, and for example, may include an inorganic insulating material such as a silicon nitride ($SiN_x$), a silicon oxide ($SiO_x$), and a silicon oxynitride ($SiO_xN_y$). According to an embodiment, the buffer layer 111 may have a single-layered or multi-layer structure including the above inorganic insulating material. A barrier layer (not illustrated) may be further positioned on the substrate 100. The barrier layer may be positioned between the substrate 100 and the buffer layer 111. The barrier layer may include an inorganic insulating material such as a silicon nitride ($SiN_x$), a silicon oxide ($SiO_x$), and a silicon oxynitride ($SiO_xN_y$). The barrier layer (not illustrated) may have a single-layered or multi-layer structure including the above inorganic insulating material.

The semiconductor 131 may be positioned on the substrate 100. The semiconductor 131 may include any one of amorphous silicon, polycrystalline silicon, and an oxide semiconductor. For example, the semiconductor 131 may include low temperature polysilicon (LTPS), or may include an oxide semiconductor including at least one of zinc (Zn), indium (In), gallium (Ga), tin (Sn), and a mixture thereof. For example, the semiconductor 131 may include an indium-gallium-zinc oxide (IGZO). The semiconductor 131 may include a channel region, a source region, and a drain region into which they are classified depending on whether or not they are doped with impurities. The source region and the drain region may have a conductive characteristic corresponding to a conductor.

The gate insulating layer 120 may cover the semiconductor 131 and the substrate 100. The gate insulating layer 120 may include an inorganic insulating material such as a silicon nitride ($SiN_x$), a silicon oxide ($SiO_x$), and a silicon oxynitride ($SiO_xN_y$). The gate insulating layer 120 may have a single-layered or multi-layer structure including the above inorganic insulating material.

The gate electrode 124 may be positioned on the gate insulating layer 120. The gate electrode 124 may include a metal such as copper (Cu), molybdenum (Mo), aluminum (Al), silver (Ag), chromium (Cr), or tantalum (Ta), or a metal alloy thereof. The gate electrode 124 may be formed as a single layer or a multilayer. A region of the semiconductor 131 that overlaps the planar gate electrode 124 may be a channel region.

The interlayer insulating layer 160 may cover the gate electrode 124 and the gate insulating layer 120. The interlayer insulating layer 160 may include an inorganic insulating material such as a silicon nitride ($SiN_x$), a silicon oxide ($SiO_x$), and a silicon oxynitride ($SiO_xN_y$). The interlayer insulating layer 160 may have a single-layered or multi-layer structure including the above inorganic insulating material.

The source electrode 173 and the drain electrode 175 are positioned on the interlayer insulating layer 160. The source electrode 173 and the drain electrode 175 may be connected to the source region and the drain region of the semiconductor 131 through openings formed in the interlayer insulating layer 160 and the gate insulating layer 120, respectively. Accordingly, the semiconductor 131, the gate electrode 124, the source electrode 173, and the drain electrode 175 described above constitute one thin film transistor TFT. According to an embodiment, the transistor TFT may include only the source region and the drain region of the semiconductor 131 instead of the source electrode 173 and the drain electrode 175.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof. The source electrode 173 and the drain electrode 175 may be formed as a single layer or a multilayer. The source electrode 173 and the drain electrode 175 according to an embodiment may be a triple layer including an upper layer, an intermediate layer, and a lower layer, the upper layer and the lower layer may include titanium (Ti), and the intermediate layer may include aluminum (Al).

The organic layer 180 may be disposed on the source electrode 173 and the drain electrode 175. The organic layer 180 covers the source electrode 173, the drain electrode 175, and the interlayer insulating layer 160. The organic layer 180, which is for planarizing a surface of the substrate 100 provided with the transistor TFT, may be an organic insulating layer, and may include at least one material of a polyimide, a polyamide, an acrylic resin, benzocyclobutene, and a phenol resin.

The pixel electrode 191 may be positioned on the organic layer 180. The pixel electrode 191 is also referred to as an anode, and may be formed as a single layer including a transparent conductive oxide film or a metal material or as multiple layers including them. The transparent conductive oxide layer may include an indium tin oxide (ITO), a poly-ITO, an indium zinc oxide (IZO), an indium gallium zinc oxide (IGZO), an indium tin zinc oxide (ITZO), and the like within the spirit and the scope of the disclosure. The metal material may include silver (Ag), molybdenum (Mo), copper (Cu), gold (Au), and aluminum (Al).

The organic layer 180 may include an opening 81 exposing the drain electrode 175. The drain electrode 175 and the pixel electrode 191 may be physically and electrically connected through the opening 81 of the organic layer 180. Accordingly, the pixel electrode 191 can receive an output current to be transferred from the drain electrode 175 to the emission layer 370.

A pixel defining layer 350 may be disposed on the pixel electrode 191 and the organic film 180. The pixel defining layer 350 has a pixel opening 351 overlapping at least a portion of the pixel electrode 191. The pixel opening 351 may overlap a central portion of the pixel electrode 191, and may not overlap an edge of the pixel electrode 191. As a result, a size of the pixel opening 351 may be smaller than that of the pixel electrode 191. The pixel defining layer 350 may define a formation position of the emission layer 370 such that the emission layer 370 may be positioned on a portion thereof where an upper surface of the pixel electrode 191 is exposed. The pixel defining layer 350 may be an organic insulating layer including at least one material selected from a group including a polyimide, a polyamide, an acrylic resin, benzocyclobutene, and a phenol resin, and according to an embodiment, the pixel defining layer 350 may be formed as a black pixel defining layer (BPDL) including a black pigment.

The emission layer 370 may be disposed within the pixel opening 351 defined by the pixel defining layer 350. The emission layer 370 may include an organic material that emits light such as red, green, and blue light. The emission layer 370 emitting red, green, and blue light may include a low molecular weight or high molecular weight organic material. In FIG. 6, the emission layer 370 is illustrated as a single layer, but in practice, an auxiliary layer such as an electron injection layer, an electron transport layer, a hole transport layer, and a hole injection layer may be included above and below the light emitting layer 370, where the hole injection layer and the hole transport layer may be disposed below the emission layer 370, and the electron transport layer and the electron injection layer may be disposed above the emission layer 370.

The common electrode 270 may be positioned on the pixel defining layer 350 and the emission layer 370. The common electrode 270 may be referred to as a cathode, and may be formed of a transparent conductive layer including an indium tin oxide (ITO), an indium zinc oxide (IZO), an indium gallium zinc oxide (IGZO), an indium tin zinc oxide (ITZO), etc., within the spirit and the scope of the disclosure. The common electrode 270 may have a translucent characteristic, and, it may constitute a micro-cavity together with the pixel electrode 191. According to such a micro-cavity structure, light of a specific (or given) wavelength is emitted to an upper part by the characteristics and spacing between both of the electrodes, and as a result, red, green, or blue light may be displayed.

The encapsulation layer 400 may be disposed on the common electrode 270. The encapsulation layer 400 may include at least one inorganic layer and at least one organic layer. In an embodiment, the encapsulation layer 400 may include a first inorganic encapsulation layer 410, an organic encapsulation layer 420, and a second inorganic encapsulation layer 430. However, this is an example, and numbers of inorganic and organic layers constituting the encapsulation layer 400 may be variously changed. The first inorganic encapsulation layer 410, the organic encapsulation layer 420, and the second inorganic encapsulation layer 430 may cover the display area DA, and may be disposed in a portion of the display area DA. According to an embodiment, the organic encapsulation layer 420 may be formed around the display area DA, and the first inorganic encapsulation layer 410 and the second inorganic encapsulation layer 430 may be disposed up to the non-display area PA. The encapsulation layer 400, which is for protecting the light emitting diode LED from moisture or oxygen that may be introduced from the outside, may directly contact first ends of the first inorganic encapsulation layer 410 and the second inorganic encapsulation layer 430.

The lower sensing insulating layer 501 may be disposed on the encapsulation layer 400. The lower sensing insulating layer 501 may be formed of an inorganic insulating layer, and an inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. According to an embodiment, the lower sensing insulating layer 501 may be omitted.

A sensing electrode connector 541, the first sensing insulating layer 510, and the sensing electrodes 520 and 540 may be positioned on the lower sensing insulating layer 501. One of the first sensing electrode connector 521 and the second sensing electrode connector 541 may be positioned at a same layer as that of the sensing electrodes 520 and 540, and the other may be positioned at a different layer from that of the sensing electrodes 520 and 540. Hereinafter, an example in which the second sensing electrode connector 541 is positioned at a different layer from that of the sensing electrodes 520 and 540 will be described.

The sensing electrode connector 541, the first sensing insulating layer 510, and the sensing electrodes 520 and 540 may constitute a sensing sensor. The sensing sensor may be classified into a resistive type, a capacitive type, an electromagnetic type, and an optical type. The sensing sensor according to an embodiment may be a capacitive type of sensor.

The sensing electrode connector 541 may be positioned on the lower sensing insulating layer 501, and the first sensing insulating layer 510 may be positioned on the lower sensing insulating layer 501 and the second sensing electrode connector 541. The first sensing insulating layer 510 may include an inorganic insulating material or an organic insulating material. An inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. An organic insulating material may include at least one of an acrylic resin, a methacrylic resin, a polyisoprene, a vinyl resin, an epoxy resin, a urethane resin, a cellulose resin, and a perylene resin.

The sensing electrodes 520 and 540 may be positioned on the first sensing insulating layer 510. The sensing electrodes 520 and 540 may include the first sensing electrodes 520 and the second sensing electrodes 540. The first sensing electrodes 520 and the second sensing electrodes 540 may be electrically insulated. The first sensing insulating layer 510 may include an opening exposing an upper surface of the second sensing electrode connector 541, and the second sensing electrode connector 541 is connected to the second sensing electrodes 540 through the opening of the first sensing insulating layer 510 to electrically connect two adjacent second sensing electrodes 540. The first sensing electrode connector 521 connecting the first sensing electrodes 520 is formed at a same layer as that of the first sensing electrodes 520 and the second sensing electrodes 540.

The sensing electrodes 520 and 540 may include a conductive material having good conductivity. For example, the sensing electrode 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof. The sensing electrodes 520 and 540 may be a single layer or a multilayer. The sensing electrodes 520 and 540 may have an opening so that light emitted from the light emitting diode is emitted upward without interference. According to an embodiment, the sensing electrodes 520 and 540 may be a triple layer including an upper layer, an intermediate layer, and a lower layer, where the upper layer and the lower layer may include titanium (Ti), and the intermediate layer may include aluminum (Al).

A first insulating layer 550 is positioned on the sensing electrodes 520 and 540 and the first sensing insulating layer 510. The first insulating layer 550 may include a light-transmitting organic insulating material having a low refractive index. For example, the first insulating layer 550 may include at least one of an acrylic resin, a polyimide resin, a polyamide resin, and Alq3 [Tris(8-hydroxyquinolinato)aluminum]. The first insulating layer 550 may have a relatively smaller refractive index than that of a second insulating layer 560 to be described later. For example, the first insulating layer 550 may have a refractive index of 1.40 to 1.59.

The first insulating layer 550 has an opening 551. The opening 551 refers to a portion where the first sensing insulating layer 510 is not covered by the first insulating layer 550. The opening 551 of the first insulating layer 550 may overlap the pixel opening 351 in a plan view, and a boundary between the pixel opening 351 and the opening 551 of the first insulating layer 550 has a distance S1 in a plan view. As a result, the pixel opening 351 is positioned in the opening 551 of the first insulating layer 550 in a plan view, and a planar size of the opening 551 of the first insulating layer 550 may be greater than that of the pixel opening 351.

A distance S1 between the pixel opening 351 and the opening 551 of the first insulating layer 550 indicates a shortest distance between an edge of the pixel opening 351 and an edge of the opening 551. An edge of the pixel opening 351 may indicate a planar shape formed by a lower point in contact with the pixel electrode 191 among edges of the pixel defining layer 350. An edge of the opening 551 of the first insulating layer 550 may indicate a planar shape formed by a lower point in contact with the first sensing insulating layer 510 among edges of the first insulating layer 550.

The separation distance S1 between the pixel opening 351 and the opening 551 of the first insulating layer 550 may not be constant depending on positions of the pixel opening 351 and the opening 551.

The second insulating layer 560 may be disposed on the first sensing insulating layer 510 and the first insulating layer 550. The second insulating layer 560 may include a light-transmitting organic insulating material having a high refractive index. The second insulating layer 560 may have a relatively larger refractive index than that of the first insulating layer 550. For example, the second insulating layer 560 may have a refractive index of 1.60 to 1.80.

The second insulating layer 560 may be positioned within the opening 551 of the first insulating layer 550. In the opening 551, the second insulating layer 560 may come into contact with a side surface of the first insulating layer 550. Since the second insulating layer 560 is also disposed on an upper surface of the first insulating layer 550, an upper surface of the first insulating layer 550 and the second insulating layer 560 are in contact with each other.

The first insulating layer 550 including the opening 551 of the first insulating layer 550 and the second insulating layer 560 positioned in the opening 551 of the first insulating layer 550 may be included on a front surface of the emission layer 370, thereby improving light output efficiency in a front direction. For example, at least some of the light generated by the light emitting diode LED may be totally reflected or reflected at an interface between the first insulating layer 550 and the second insulating layer 560 so that the light may be condensed to the front.

Improvement of light output efficiency in the front direction will be described below.

Light L generated from the light emitting layer 370 is emitted in various directions, and is incident on the first insulating layer 550 and the second insulating layer 560 with various incident angles. Some light L is incident on the interface between the first insulating layer 550 and the second insulating layer 560, and is totally reflected or reflected due to a difference in refractive indices of the first insulating layer 550 and the second insulating layer 560. For example, in case that an incident angle of the light L incident on a boundary surface is greater than a threshold angle, the incident light L may be totally reflected on the boundary surface between the first insulating layer 550 and the second insulating layer 560. In case that the light L incident on the second insulating layer 560 having a relatively large refractive index travels to the first insulating layer 550 having a relatively small refractive index and an incident angle thereof is greater than or equal to a certain angle (threshold angle), total reflection occurs at the interface between the first insulating layer 550 and the second insulating layer 560. As such, luminance at the front is improved and output efficiency is improved by changing a travel direction of the light L that is required to travel to a side surface thereof from the interface between the first insulating layer 550 and the second insulating layer 560 to the front.

Although not illustrated, in the display device, a polarization layer including a linear polarizer, a retarder, etc. may be further positioned, and a cover window may be further positioned on the polarization layer. An adhesive layer may be further positioned between the polarization layer and the cover window.

Hereinafter, planar structures of the pixel opening 351 of the display device and the opening 551 of the first insulating layer 550 will be described in detail with reference to FIG. 7A and FIG. 7B.

Figure 7A:
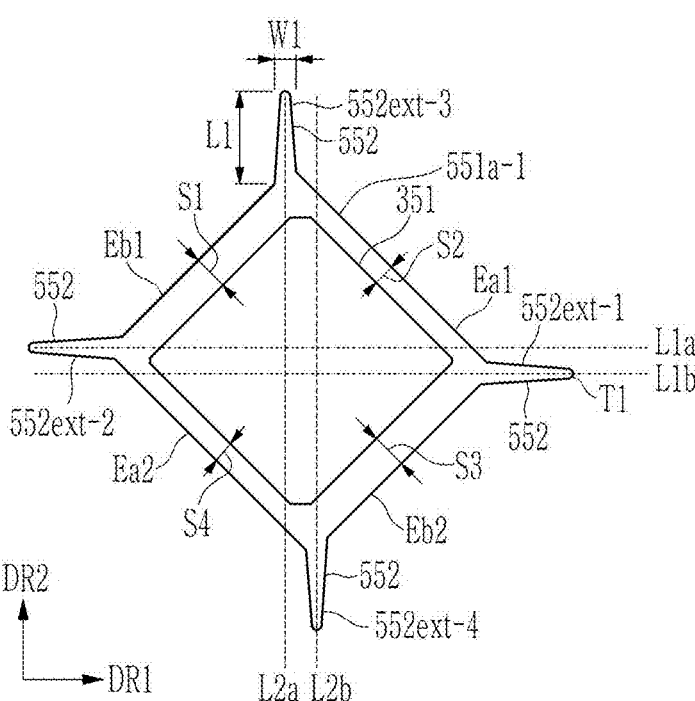
FIG. 7A and FIG. 7B each illustrate a schematic top plan view showing a portion of a display device according to an embodiment.
Figure 7B:
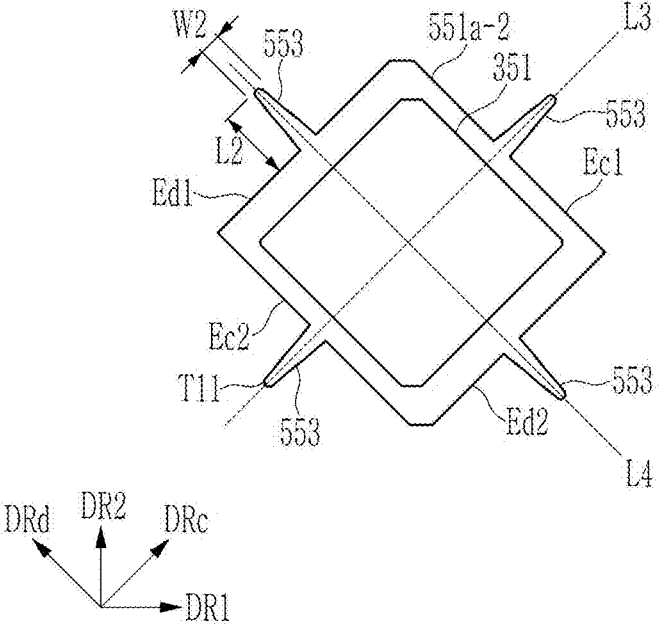

FIG. 7A and FIG. 7B each illustrate a schematic top plan view showing a portion of a display device according to an embodiment.

FIG. 7A and FIG. 7B illustrate only the pixel opening 351 of the display device and openings 551 of the first insulating layer 550, the emission layer 370 is positioned in the pixel opening 351 of the pixel defining layer 350, and the second insulating layer 560 is positioned in the openings 551 of the first insulating layer 550. The openings 551 of the first insulating layer 550 may include a first opening 551*a*-1 of the first insulating layer 550 (FIG. 7A) and a second opening 551-*a*2 of the first insulating layer 550 (FIG. 7B). Each of the first opening 551*a*-1 and the second opening 551*a*-2 positioned in the first insulating layer 550 may include at least one protruding extension.

A planar structure of FIG. 7A will be described as follows.

Referring to FIGS. 6 and 7A, the first opening 551*a*-1 of the first insulating layer 550 overlaps a pixel opening 351. The pixel opening 351 may be positioned only inside the first opening 551*a*-1 of the first insulating layer 550 in a plan view. The area and size of the first opening 551*a*-1 of the first insulating layer 550 may be larger than those of the pixel opening 351.

The pixel opening 351 may have a substantially polygonal shape in a plan view, and may have a structure in which at least one of polygonal corners is chamfered. According to an embodiment shown in FIG. 7A, the pixel opening 351 has a rhombus shape, and two of the corners are chamfered, so that the pixel opening 351 may have a substantially rectangular (rhombus) planar shape. Chamfered edges may be edges that are straightly or curvedly chamfered. However, the planar shape of the pixel opening 351 is not limited thereto, and may be variously changed. For example, a planar shape of the pixel opening 351 may have various polygons, or may be circular or elliptical.

A planar shape of the first opening 551*a*-1 of the first insulating layer 550 may be similar to that of the pixel opening 351. The first opening 551*a*-1 of the first insulating layer 550 may be larger than the pixel opening 351 in a plan view, and an edge of the first opening 551*a*-1 may be positioned outside that of the pixel opening 351.

The first opening 551*a*-1 of the first insulating layer 550 may include edges Ea1, Ea2, Eb1, and Eb2 substantially parallel to edges of the pixel opening 351 in a plan view, and may have a polygonal shape. According to FIG. 7A, a first extension 552 is positioned between two adjacent edges of the edges Ea1, Ea2, Eb1, and Eb2 extending in different directions. In FIG. 7A, a total of four first extensions 552 are included, and the four first extensions have a structure in which they protrude in a cross shape. Hereinafter, a structure of the first opening 551a-1 of the first insulating layer 550 according to FIG. 7A is referred to as the first opening 551a-1 or a cross opening.

Each edge of the pixel opening 351 may have a planar shape formed by a lower point in contact with the pixel electrode 191 among edges of the pixel defining layer 350, and an edge of the first opening 551a-1 may have a planar shape formed by a lower point in contact with the first sensing insulating layer 510 among edges of the first insulating layer 550.

The first opening 551a-1 of the first insulating layer 550 may have a first edge Ea1 and a second edges Ea2 extending in a same direction and spaced apart from each other, and a third edge Eb1 and a fourth edge Eb2 extending in different directions from that of the first edge Ea1 and the second edge Ea2 and spaced apart from each other substantially in parallel with each other.

A first interval S1 may be formed between the third edge Eb1 of the first opening 551a-1 of the first insulating layer 550 and an edge of the pixel opening 351 adjacent thereto, a second interval S2 may be formed between the first edge Ea1 of the first opening 551a-1 of the first insulating layer 550 and an edge of the pixel opening 351 adjacent thereto, a third interval S3 may be formed between the fourth edge Eb2 of the first opening 551a-1 of the first insulating layer 550 and an edge of the pixel opening 351 adjacent thereto, and a fourth interval S4 may be formed between the second edge Ea2 of the first opening 551a-1 of the first insulating layer 550 and an edge of the pixel opening 351 adjacent thereto.

The first interval S1, the second interval S2, the third interval S3, and the fourth interval S4 may not be constant. For example, the first interval S1 and the third interval S3 may be approximately the same, the second interval S2 and the fourth interval S4 may be approximately the same, and the first interval S1 and the third interval S3 may be greater than the second interval S2 and the fourth interval S4. The intervals S1 and S3 between the third edge Eb1 and the fourth edge Eb2 extending in a same direction and spaced apart from each other to face each other and adjacent edges of the pixel opening 351 may be substantially the same, and the intervals S2 and S4 between the first and second edges Ea1 and Ea2 facing each other and adjacent edges of the pixel opening 351 may be substantially the same. The intervals S1 and S3 between the third edge Eb1 and the fourth edge Eb2 and the adjacent edges of the pixel opening 351 may be greater than the intervals S2 and S4 between the first and second edges Ea1 and Ea2 and the adjacent edges of the pixel opening 351.

A distance between the edge of the first opening 551a-1 of the first insulating layer 550 and the edge of the pixel opening 351 is not constant, and thus an imaginary first line L1a and a second line L1b representing extension directions of two of the first extensions 552 extending in parallel with the first direction DR1 as lines may not overlap each other. An imaginary third line L2a and a fourth line L2b representing extension directions of the two more first extensions 552 extending in parallel with the second direction DR2 as lines may not overlap each other. For example, four of the first extensions 552 of the first opening 551a-1 of the first insulating layer 550 may include one extension and another extension (hereinafter also referred to as a first subextension 552ext-1 and a second subextension 552ext-2, respectively) extending in a direction parallel to the first direction DR1 and yet another extension and one more extension (hereinafter also referred to as a third subextension 552ext-3 and a fourth subextension 552ext-4, respectively) extending in a direction parallel to the second direction DR2, the imaginary first line L1a overlapping the first subextension and parallel to the first direction DR1 and the imaginary second line L1b overlapping the second subextension and parallel to the first direction DR1 may not overlap each other, and the imaginary third line L2a overlapping the third subextension and parallel to the second direction DR2 and the imaginary fourth line L2b overlapping the fourth subextension and parallel to the second direction DR2 may not overlap each other.

As such, even in case that there is an error in the process, it is possible to prevent variation of light output efficiency by forming a non-uniform distance between the edge of the first opening 551a-1 of the first insulating layer 550 and the edge of the pixel opening 351. A change in light output efficiency as the second interval S2 and the fourth interval S4 decreases is substantially the same as a change in light output efficiency as the first interval S1 and the third interval S3 increase, so that compensation of light output efficiency may be made. For example, even in case that an error occurs during a process, it is possible to prevent occurrence of variations in light output efficiency.

In the first opening 551a-1 of the first insulating layer 550 according to an embodiment of FIG. 7A, an extension of the first extensions 552 may be positioned between the first edge Ea1 and the third edge Eb1 extending in different directions, another extension of the first extensions 552 between the first edge Ea1 and the fourth edge Eb2, yet another extension of the first extensions 552 between the second edge Ea2 and the third edge Eb1, and one more extension of the first extensions 552 between the second edge Ea2 and the fourth edge Eb2.

A direction in which two of the first extensions 552 of the first opening 551a-1 of the first insulating layer 550 protrude into the first insulating layer 550 may correspond to the first direction DR1. A direction in which two others of the first extensions 552 of the first opening 551a-1 of the first insulating layer 550 protrude into the first insulating layer 550 may correspond to the second direction DR2.

The first extensions 552 may have an elongated shape in which a first width W1, which is a maximum width, is shorter than a first length L1 measured along the extending direction, and a width may decrease from an edge to an end of the opening. Each end T1 of the first extensions 552 may have a convex curve shape. For example, the first width W1, which is a maximum width of the first extensions 552, may be greater than about 0 μm and less than or equal to about 4 μm.

A planar structure of FIG. 7B will be described below.

Unlike the first opening 551a-1 of FIG. 7A, the second opening 551a-2 of the first insulating layer 550 of FIG. 7B has a structure in which four extensions protrude in an x-shape. Hereinafter, the structure of the second opening 551a-2 of the first insulating layer 550 according to FIG. 7B is referred to as the second opening 551a-2 or an x-shaped opening.

The pixel opening 351 illustrated in FIG. 7B is the same as that of FIG. 7A, and a planar shape of the second opening 551a-2 of the first insulating layer 550 excluding the second extension 553 may be similar to a planar shape of the first opening 551a-1 of the first insulating layer 550 excluding the first extensions 552. The edges Ec1, Ec2, Ed1, and Ed2 of the second opening 551a-2 of the first insulating layer 550 illustrated in FIG. 7B may be substantially parallel to the edges of the pixel opening 351 and may have same characteristics the edges Ea1, Ea2, Eb1, and Eb2 of FIG. 7A.

The second opening 551a-2 of the first insulating layer 550 according to an embodiment of FIG. 7B may include second extensions 553 protruding from central portions of the edges Ec1, Ec2, Ed1, and Ed2.

Two second extensions 553 extending in a fourth direction DRc forming an oblique line with the first direction DR1 and the second direction DR2 may overlap an imaginary fifth line L3 extending in the fourth direction Drc, and two second extensions 553 oblique to the first direction DR1 and the second direction DR2 and extending in a fifth direction that is DRd different from the fourth direction DRc may overlap an imaginary sixth line L4 extending in the fifth direction DRd. For example, the two second extensions 553 extending in the fourth direction DRc may positioned on a substantially straight line, and the two second extensions 553 extending in the fifth direction DRd may be positioned on a substantially straight line. In other words, the second extensions 553 of the second opening 551a-2 of the first insulating layer 550 include two extensions extending in a direction parallel to the fourth direction DRc (hereinafter also referred to as a fifth subextension and a sixth subextension) and two extensions extending in a direction parallel to the fifth direction DRd (hereinafter also referred to as a seventh subextension and an eighth subextension), an imaginary fifth line L3 overlapping the fifth subextension and parallel to the fourth direction DRc overlaps the sixth subextension, and an imaginary sixth line L4 overlapping the seventh subextension and parallel to the fifth direction DRd may overlap the eighth subextension. However, according to an embodiment, each of the two second extensions 553 extending in the fourth direction DRc or the fifth direction DRd may not be positioned on a straight line.

Directions in which the extensions 553 protrudes from the second opening of the first insulating layer 550 may correspond to the fourth direction DRc and the fifth direction DRd, respectively. The fourth direction DRc and the fifth direction DRd may form 45 degrees or about 45 degrees with the first direction DR1 and/or the second direction DR2, and may have an angle of 35 degrees or about 35 degrees or more and 55 degrees or less or about 55 degrees or less according to an embodiment.

The second extensions 553 may have an elongated shape in which a second width W2, which is a maximum width, is shorter than a second length L2 measured along the extending direction, and a width may decrease from an edge to an end of the first opening. Each end T11 of the second extensions 553 may have a convex curve shape. For example, the second width W2, which is the maximum width of the second extensions 553, may be greater than about 0 μm and less than or equal to about 4 μm, like the first extensions 552.

Lengths of the second extensions 553 and the first extensions 552 may be the same, or the first extensions 552 may be formed to be longer than the second extensions 553. However, according to an embodiment, the second extensions 553 may be formed longer than the first extensions 552.

The first extensions 552 and the second extensions 553 of the first opening 551a-1 and the second opening 551a-2 of the first insulating layer 550 illustrated in FIG. 7A and FIG. 7B, respectively, have an elongated shape and thus in case that forming the second insulating layer 560, also serves to help a material constituting the second insulating layer 560, which is dropped by capillary action, to be well covered up to edges and corners of the first and second openings 551a-1 and 55a-2 of the first insulating layer 550, which will be described in more detail with reference to FIG. 8.

FIG. 8 illustrates a schematic cross-sectional view showing a step in a manufacturing process of a display device according to an embodiment.

In FIG. 8, a step is illustrated in which the first insulating layer 550 having the opening 551 is formed, and the second insulating layer 560 is formed by dripping and curing droplets 560-D of the material constituting the second insulating layer 560 is illustrated.

The droplets 560-D dripped on a surface of the first insulating layer 550 may move toward the opening 551 of the first insulating layer 550 to fill the opening 551 of the first insulating layer 550, and in case that the extensions 552 and 553 are not formed in the opening 551 of the first insulating layer 550, the dripped droplets 560-D may not be sufficiently filled in an end portion EP of the edges Ea1, Ea2, Eb1, and Eb2 of the opening 551 of the first insulating layer 550, for example an edge portion between two adjacent edges extending in different directions.

As such, the material for forming the second insulating layer 560 may not be positioned at the edge of the opening 551 of the first insulating layer 550, whereby the second insulating layer 560 may not be uniformly formed on the entire substrate. A method of forming the second insulating layer thickly by increasing an amount of droplets 560-D may be considered in order to form the second insulating layer 560, but accordingly, there may be a disadvantage in that a thickness of the display device is increased. Another problem may occur due to thickness in a subsequent process, and in the case of a foldable product, there may be a problem in that a folding characteristic or an impact resistance characteristic are deteriorated.

However, in case that the extensions 552 and 553 are formed in openings 551 of the first insulating layer 550, as the droplets 560-D flow into an additional space generated by the extensions 552 and 553, the opening 551 of the first insulating layer 550 may be filled. For example, the elongated extensions 552 and 553 serve to diffuse a material layer constituting the second insulating layer 560 dripped by capillary action toward the edge of the opening 551 of the first insulating layer 550.

Accordingly, in accordance with the display device according to embodiment, a material for forming the second insulating layer may be uniformly positioned in openings 551 of the first insulating layer 550, thereby uniformly forming the second insulating layer with a thin thickness. As such, an overall thickness of the display device may be reduced, problems occurring in post-processing may be solved, and it may be stably used for foldable products.

In accordance with the display device according to embodiment, in case that a thickness of the first insulating layer 550 is in a range of about 2 μm to about 4 μm, by way of example, in case that it is in a range of about 2.3 μm to about 3.5 μm, a thickness of the second insulating layer 560 may be in a range of about 9 μm or more and about 11 μm or less, and the second insulating layer 560 is not unevenly filled in the opening of the first insulating layer 550, so that the surface of the second insulating layer 560 may be flat. In general, unlike in the display device according to an embodiment, in case that the opening 551 of the first insulating layer 550 does not include the extensions 552 or the extensions 553, in case that the thickness of the first insulating layer 550 is in a range of about 2 μm to about 4 μm, by way of example, in case that it is in a range of about 2.3 μm to about 3.5 μm, and in case that the thickness of the second insulating layer 560 is in a range of about 25 μm or more, the second insulating layer 560 is not unevenly filled in the opening of the first insulating layer 550, and the surface of the second insulating layer 560 may be flat, and thus it can be seen that there is a large difference in thickness.

Capillary pressure Pc may be defined by Equation 1 below.

$$Pc = \gamma \left( \frac{1}{Rx} + \frac{1}{Ry} \right) \qquad \text{(Equation 1)}$$

Herein, γ indicates surface tension, Rx indicates a variable related to a shape of a portion filled with liquid, for example, a value that increases as it approaches a circle, and Ry indicates a value that increases as a depth of the portion filled with the liquid increases.

Accordingly, as the portion filled with the liquid is close to a circle, the capillary pressure decreases, thereby making it difficult to fill the liquid. For example, as the shape of the opening 551 of the first insulating layer 550 is close to a circular shape, the material for forming the second insulating layer 560 may not be uniformly filled in the opening 551. Accordingly, in an embodiment, the opening 551 of the first insulating layer 550 may be formed to have a polygonal shape.

In the above, the structure of the first opening 551*a*-1 and the second opening 551*a*-2 of the first insulating layer 550 having different extensions 552 and 553 as illustrated in FIG. 7A and FIG. 7B, respectively, has been described. In the first insulating layer 550 of the display device according to an embodiment, both the first opening 551*a*-1 (referred to as the first opening or a cross opening) having the extension 552 as illustrated in FIG. 7A and the second opening 551*a*-2 having the extension 553 as illustrated in FIG. 7B (referred to as the second opening or an x-shaped opening) may be formed, and a disposal of the first opening and the second opening according to an embodiment will be described with reference to FIG. 9.

FIG. 9 illustrates a schematic top plan view showing a portion of a display area in a display device according to an embodiment.

In FIG. 9, the sensing electrode 540 in addition to pixel openings 351 and openings of the first insulating layer 550 is illustrated. In FIG. 9, the sensing electrode 540 is positioned under or below the first insulating layer 550, which is illustrated by a thin line.

In an embodiment of FIG. 9, the extensions 552 and 553 of the first and second openings 551*a*-1 and 551*a*-2 of the first insulating layer 550 do not overlap the sensing electrode 540 in a plan view. For example, edges of the first opening 551*a*-1 and the second opening 551*a*-2 of the first insulating layer 550 respectively including first extensions 552 and second extensions 553, respectively, may not overlap the sensing electrode 540 in a plan view, and first lengths L1 and second lengths L2 of the first extensions 552 and the second extensions 553 may also have a length that does not overlap the sensing electrode 540. In a plan view, a gap between the first extension 552 and the sensing electrode 540 may be wider than a gap between the second extension 553 and the sensing electrode 540. The second length L2 of the second extension 553 may be substantially equal to or shorter than the first length L1 of the first extension 552. According to an embodiment, the gap between the first extension 552 and the sensing electrode 540 may be narrower than the gap between the second extension 553 and the sensing electrode 540, and the second length L2 of the second extension 553 may be longer than the first length L1 of the first extension 552.

Referring to FIG. 9, the pixel defining layer 350 of the display device according to an embodiment may include a first pixel opening 351*a* in which an emission layer emitting a first color is disposed, a second pixel opening 351*b* in which an emission layer emitting a second color is disposed, and a third pixel opening 351*c* in which an emission layer emitting a third color is disposed. Herein, the second pixel opening 351*b* in which the emission layer emitting the second color is disposed may be arranged in two directions, and the two directions may have an angle of 90 degrees or about 90 degrees to each other. In an embodiment of FIG. 9, the first color may be red R, the second color may be green G, and the third color may be blue B.

The first pixel opening 351*a* and the third pixel opening 351*c* are alternately positioned along the first direction DR1 and the second direction DR2 that are perpendicular to each other, and the second pixel opening 351*b* is positioned in a diagonal direction from the first pixel opening 351*a* and the third pixel opening 351*c*. The adjacent second pixel openings 351*b* may be arranged in different directions among the two directions.

One first pixel opening 351*a*, one third pixel opening 351*c*, and two second pixel openings 351*b* may each be positioned at a vertex position of a virtual rhombus to form one dot. Herein, the dot may indicate a basic unit capable of displaying white together including three different primary colors.

The first insulating layer 550 of the display device according to an embodiment may include a first color opening 551*a* overlapping the first pixel opening 351*a*, a second color opening 551*b* overlapping the second pixel opening 351*b*, and a third color opening 551*c* overlapping the third pixel opening 351*c*. In an embodiment of FIG. 9, the first pixel opening 351*a*, the second pixel opening 351*b*, and the third pixel opening 351*c* of the pixel defining layer 350, and the first color opening 551*a*, the second color opening 551*b*, and the third color opening 551*c* of the first insulating layer 550 do not overlap the sensing electrodes 540.

The first color opening 551*a*, the second color opening 551*b*, and the third color opening 551*c* of the first insulating layer 550 of the display device according to an embodiment may be respectively divided into first openings 551*a*-1, 551*b*-1, and 551*c*-1 (also called cross openings) and second openings 551*a*-2, 551*b*-2, and 551*c*-2 (also called x-shaped openings) depending on positions of the extensions. For example, the first openings 551*a*-1, 551*b*-1, and 551*c*-1 are positioned at corners where two edges of the first extensions 552*a*, 552*b*, and 552*c* extend in different directions meet, and in the second openings 551*a*-2, 551*b*-2, and 551*c*-2, the second extensions 553*a*, 553*b*, and 553*c* protrude from a central portion of the edges.

The first extensions 552*a*, 552*b*, and 552*c* and the second extensions 553*a*, 553*b*, and 553*c* may have same characteristics as described with reference to FIG. 7A and FIG. 7B. For example, the first extensions 552*a*, 552*b*, and 552*c* and the second extensions 553*a*, 553*b*, and 553*c* have a smaller maximum width than a length measured along the extending direction to have an elongated shape, a width thereof may decrease toward an end thereof, and each end thereof may have a planar shape of a convex curve. According to an embodiment, positions, sizes, and shapes of the first extensions 552*a*, 552*b*, and 552*c* and the second extensions 553*a*, 553*b*, and 553*c* may be variously modified.

During a manufacturing process, a material constituting the second insulating layer 560, which is dropped through a capillary phenomenon, is diffused toward edges of the openings 551*a*, 551*b*, and 551*c* of the first insulating layer 550 to be uniformly formed without empty areas by elongated shapes of the first extensions 552*a*, 552*b*, 552*c* and the second extensions 553*a*, 553*b*, and 553*c*. A thickness may not be thick in order to form the second insulating layer 560 uniformly, and thus a thickness of the display device may be reduced so that it can be more readily folded in case that the display device is folded, and problems occurring in the subsequent process can be solved.

A distance between the pixel openings 351*a*, 351*b*, and 351*c* of the pixel defining layer 350 and the openings 551*a*, 551*b*, and 551*c* of the first insulating layer 550 may be in a range of about 0.1 μm to about 2.0 μm.

A distance between each edge of the openings 551*a*, 551*b*, and 551*c* of the first insulating layer 550 and a corresponding edge among edges of the pixel openings 351*a*, 351*b*, and 351*c* is not uniformly formed, and thus even in case that there is an error in a process, it is possible to prevent fluctuations in light output efficiency from occurring. For example, even in case that second distances S2*a*, S2*b*, and S2*c* and fourth distances S4*a*, S4*b*, and S4*c* become small due to a process error, as first distances S1*a*, S1*b*, S1*c* and the third distances S3*a*, S3*b*, S3*c* increase, no change may be made in the light output efficiency and compensation may be made. In FIG. 9, each of the distances S1, S2, S3, and S4 is illustrated only in the first openings 551*a*-1, 551*b*-1, and 551*c*-1, but only the positions of the second openings 551*a*-2, 551*b*-2, 551*c*-2 and the extensions are different, a distance characteristic may be equally applied to the second openings 551*a*-2, 551*b*-2, and 551*c*-2.

In the display device according to an embodiment of FIG. 9, the first openings 551*a*-1, 551*b*-1, and 551*c*-1 and the second openings 551*a*-2, 551*b*-2, and 551*c*-2 are formed together in the first insulating layer 550. Herein, in the first openings 551*a*-1, 551*b*-1, and 551*c*-1, the extensions protrude in a cross-shaped directions DRcr, and in the second openings 551*a*-2, 551*b*-2, and 551*c*-2, the extensions protrude in an x-shaped directions DRx, and thus in case that all directions of the extensions of the openings formed in the first insulating layer 550 are combined, at least eight directions are provided. Herein, the at least eight directions may include the cross direction and the x-shaped direction. The first openings 551*a*-1, 551*b*-1, and 551*c*-1 and the second openings 551*a*-2, 551*b*-2, and 551*c*-2 are formed together, and thus the display device may have a uniform display quality of a certain level or more irrespective of an azimuth angle due to the extensions protruding in the at least eight directions.

The display quality will be described with reference to FIG. 10 and FIG. 11.

A difference between display characteristics of the first openings 551*a*-1, 551*b*-1, and 551*c*-1 and the second openings 551*a*-2, 551*b*-2, and 551*c*-2 will be described with reference to FIG. 10.

FIG. 10 illustrates a display characteristic depending on a position of an extension.

FIG. 10A illustrates an enlarged photograph of the first opening 551*a*-1 for the first color and the first opening 551*b*-1 for the second color among the first openings, and FIG. 10B illustrates an enlarged photograph of the second opening 551*a*-2 for the first color and the second opening 551*b*-2 for the second color among the second openings.

Referring to FIG. 10A, it can be seen that the first opening has first extensions protruding in a cross shape and transmittance is lowered in a portion where the first extension is positioned. Referring to FIG. 10B, it can be seen that the second opening has second extensions protruding in an x-shape and transmittance is lowered at a portion where the second extension is positioned.

Accordingly, in the display device including only the first opening having the first extensions protruding in a cross shape, display luminance is lowered in horizontal and vertical directions in which the first extension is positioned, so that display quality is changed depending on an angle. In the display device including only the second opening having the second extensions protruding in an x-shape, display luminance is lowered in a diagonal direction in which the second extension is positioned, so that display quality is changed depending on an angle.

However, as in an embodiment, in case that both the first opening and the second opening are included and are alternately arranged, a change in display luminance depending on an azimuth angle is small, so that a change in display quality depending on an azimuth angle is also small.

The change in display quality depending on the azimuth angle is compared with a comparative example through FIG. 11.

FIG. 11 illustrates a comparison of a difference in display characteristics between an example and a comparative example.

Referring to FIG. 11, the example of FIG. 9 and the comparative example are compared, and in unlike FIG. 9, a structure of the comparative example may include only a first opening having first extensions protruding in a cross shape from the first insulating layer 550. In FIG. 9, the first opening having the first extensions protruding in the cross shape and the second opening having the second extensions protruding in the x-shape are included together.

A graph is illustrated below a shape of the opening of the first insulating layer 550 of the comparative example and the example of FIG. 9, and a diagram of a luminance deviation depending on the azimuth angle is illustrated therebelow.

The graph of FIG. 11 shows that the luminance is measured while changing an elevation angle with respect to an azimuth angle of 0 degrees or about 0 degrees and an azimuth angle of 45 degrees or about 45 degrees, the x-axis of the graph represents the elevation, and the y-axis represents a normalized luminance value. In the graph of FIG. 11, as a difference in luminance in the two azimuth angles decreases, it indicates that a difference in display quality depending on the azimuth angle is small, and it can be seen that there may be a slight difference between the example of FIG. 9 and the comparative example.

Referring to a photographic diagram of the luminance deviation depending on the azimuth angle in FIG. 11, in the comparative example, it can be seen that the luminance is larger in the form of an x, but in an embodiment of FIG. 9, it can be seen that such a difference is small.

As such, openings having protruding extensions of which positions are different may be formed in the first insulating layer 550 to reduce differences in luminance and display quality depending on the azimuth angles.

The above descriptions have been made based on an embodiment of FIG. 9.

A disposal of the first opening and the second opening formed in the first insulating layer 550 according to an embodiment of FIG. 9 may be the same as that of FIG. 12.

FIG. 12 illustrates a schematic top plan view showing a portion of a display area in a display device according to an embodiment.

In an embodiment of FIG. 12, an opening positioned in the first insulating layer 550 has four extensions, and two openings having different protruding directions are included for each color. For example, the first color opening 551*a* may include a first opening 551*a*-1 for the first color and a second opening 551*a*-2 for the first color, the second color opening 551*b* may include a first opening 551*b*-1 for the second color and a second opening 551*b*-2 for the second color, and the third color opening 551*c* may include a first opening 551*c*-1 for the third color and a second opening 551*c*-2 for the third color.

In FIG. 12, the first openings 551*c*-1 for the third color and the first openings 551*a*-1 for the first color are alternately positioned in a first row, and the first opening 551*b*-1 for the second color is positioned in a second row. The first openings 551*b*-1 for the second color positioned in the second row may be alternately positioned in two directions. Herein, the two directions may form an angle of 90 degrees or about 90 degrees with each other. In the third row, the second openings 551*a*-2 for the first color and the second openings 551*c*-2 for the third color are alternately positioned, and in the fourth row, the second openings 551*b*-2 for the second color are positioned. The second openings 551*b*-2 for the second color positioned in the fourth row may be alternately positioned in two directions, and the two directions may form a 90-degree angle with each other.

As such, the first openings 551*a*-1, 551*b*-1, and 551*c*-1 having the first extensions protruding in the cross shape and the second openings 551*a*-2, 551*b*-2, and 551*c*-2 having the second extensions protruding in a x-shape are included for each color, and thus a constant level of display quality may be displayed regardless of the azimuth angle by ensuring that display quality does not change significantly depending on the azimuth angle by preventing the luminance from being high at a specific (or given) azimuth angle.

According to an embodiment, the disposal of the first openings 551*a*-1, 551*b*-1, and 551*c*-1 and the second openings 551*a*-2, 551*b*-2, and 551*c*-2 may vary, and this will be described in detail with reference to FIG. 13 to FIGS. 17A-17F.

FIG. 13 illustrates various embodiments depending on positions of an extension in a display device according to an embodiment, and FIGS. 14A-14F to FIGS. 17A-17F each illustrate a schematic top plan view showing a portion of a display area in a display device according to an embodiment.

Before describing FIGS. 14A-14F to FIGS. 17A-17F, a basic unit structure in which the first opening and the second opening can be arranged will be described with reference to FIG. 13.

In FIG. 13, a first color R and a second color G are grouped, and the second color G and a third color B are grouped to divide them into basic units, and various disposals are described in FIGS. 14A-14F to FIGS. 17A-17F by using each basic unit.

An opening included in the basic unit of FIG. 13 will be described in detail as follows.

The basic unit grouping the second color G and the third color B (collectively BG) is divided into a total of four basic units B1, B2, B3, and B4.

The basic unit B1 has a structure in which the first opening 551*c*-1 for the third color and the first opening 551*b*-1 for the second color are adjacently positioned, the basic unit B2 has a structure in which the second opening 551*c*-2 for the third color and the second opening 551*b*-2 for the second color are adjacently positioned, the basic unit B3 has a structure in which the first opening 551*c*-1 for the third color and the second opening 551*b*-2 for the second color are adjacently positioned, and the basic unit B4 has a structure in which the second opening 551*c*-2 for the third color and the first opening 551*b*-1 for the second color are adjacently positioned. In the basic units B1, B2, B3, and B4 of FIG. 13, only one of the two directions is illustrated as an arrangement direction of the first opening 551*b*-1 for the second color or the second opening 551*b*-2 for the second color, but the first openings 551*b*-1 for the second color or the second openings 551*b*-2 for the second color may be positioned in different directions by 90 degrees or about 90 degrees depending on a position thereof.

The basic unit grouping the first color R and the second color G (collectively RG) is divided into a total of four basic units R1, R2, R3, and R4.

The basic unit R1 has a structure in which the first opening 551*a*-1 for the first color and the first opening 551*b*-1 for the second color are adjacently positioned, the basic unit R2 has a structure in which the second opening 551*a*-2 for the first color and the second opening 551*b*-2 for the second color are adjacently positioned, the basic unit R3 has a structure in which the first opening 551*a*-1 for the first color and the second opening 551*b*-2 for the second color are adjacently positioned, and the basic unit R4 has a structure in which the second opening 551*a*-2 for the first color and the first opening 551*b*-1 for the second color are adjacently positioned. Even in the basic units R1, R2, R3, and R4 of FIG. 13, only one of the two directions is illustrated as an arrangement direction of the first opening 551*b*-1 for the second color or the second opening 551*b*-2 for the second color, but the first openings 551*b*-1 for the second color or the second openings 551*b*-2 for the second color may be positioned in different directions by 90 degrees or about 90 degrees depending on a position thereof.

The structure of the basic unit as illustrated in FIG. 13 may be arranged in various ways, and hereinafter, various arrangements will be described with reference to FIGS. 14A-14F to FIGS. 17A-17F.

In FIGS. 14A-14F to FIGS. 17A-17F, they are shown in a tabular form, and B1, B2, B3, B4, R1, R2, R3, and R4 are described. In case that B1 is described, it indicates that a structure of a basic unit of B1 of FIG. 13 is positioned at a corresponding position.

FIGS. 14A-14F illustrate various arrangements with only basic units B1, B2, R1, and R2, and portions enclosed by thick lines indicate a unit arrangement structure including basic units.

In FIG. 14A, the basic units B1 and R1 are alternately arranged in a first row, and the basic units B2 and R2 are alternately arranged in a second row. An arrangement of FIG. 14A may be the same as that of FIG. 12.

In FIG. 14B, the basic units B1 and R1 are alternately arranged in a first column, and the basic units B2 and R2 are alternately arranged in a second column.

In FIG. 14C, the basic units B1 and R1 are alternately arranged in a 2×2 arrangement structure, and the basic units B2 and R2 are alternately arranged in an adjacent 2×2 arrangement structure. The two 2×2 unit arrangement structures are alternately arranged as a whole.

In FIG. 14C and FIG. 14D, the basic units B1 and R1 are alternately arranged in a 1×2 arrangement structure, and the basic units B2 and R2 are alternately arranged in an adjacent 1×2 arrangement structure. A unit arrangement structure of such 1×2 arrangements are alternately arranged as a whole, and a difference between FIG. 14D and FIG. 14E is distinguished according to which direction a position of the 1×2 arrangement structure is moved and positioned in a next row.

In FIG. 14F, the basic units B1 and R1 are alternately positioned as an embodiment of a unit arrangement structure of a 4×4 arrangement, and in an adjacent 4×4 arrangement structure, the basic units B2 and R2 are alternately positioned. However, in FIG. 14F, although only an 6×6 arrangement is illustrated, an overall disposal is not illustrated, but a unit arrangement structure may be alternately positioned, and thus it is not difficult to check an overall structure.

In addition to the six arrangements shown in FIGS. 14A-14F, various other arrangements may be made.

FIGS. 15A-15F illustrate various arrangements of only the basic units B3, B4, R3, and R4, and FIGS. 16A-16F illustrate various arrangements of only the basic units B1, B2, R3, and R4. FIGS. 15A-15F and FIGS. 16A-16F each illustrate a same arrangement structure as that in FIG. 24, but are an embodiment different from an embodiment of FIGS. 14A-14F in the basic unit included in the arrangement.

FIGS. 17A-17F illustrate an embodiment in which all the basic units B1, B2, B3, B4, R1, R2, R3, and R4 are included.

An embodiment of FIGS. 17A-17F will be described in detail as follows.

In FIG. 17A, the basic units B1 and R1 are alternately arranged in a first row, the basic units B2 and R2 are alternately arranged in a second row, the basic units B3 and R3 are alternately arranged in a third row, and the basic units B4 and R4 are alternately arranged in a fourth row.

In FIG. 17B, the basic units B1 and R1 are alternately arranged in a first column, the basic units B2 and R2 are alternately arranged in a second column, the basic units B3 and R3 are alternately arranged in a third column, and the basic units B4 and R4 are alternately arranged in a fourth column.

In FIG. 17C, a structure having four 2×2 arrangement structures that are repeatedly arranged is provided. The basic units B1 and R1 are alternately positioned in a first 2×2 arrangement structure, the basic units B2 and R2 are alternately positioned in a second 2×2 arrangement structure, the basic units B3 and R3 are alternately positioned in a second 2×2 arrangement structure, and the basic units B4 and R4 are alternately positioned in a fourth 2×2 arrangement structure.

In FIG. 17D and FIG. 17E, a structure having four 1×2 arrangement structures that are repeatedly arranged is provided. The basic units B1 and R1 are alternately positioned in a first 1×2 arrangement structure, the basic units B2 and R2 are alternately positioned in a second 1×2 arrangement structure, the basic units B3 and R3 are alternately positioned in a second 1×2 arrangement structure, and the basic units B4 and R4 are alternately positioned in a fourth 1×2 arrangement structure. A difference between FIG. 17D and FIG. 17E is distinguished according to which direction a position of the 1×2 arrangement structure is moved and positioned in a next row.

In FIG. 17F, a structure in which a unit arrangement structure of four 4×4 arrangements is repeatedly positioned is provided. The basic units B1 and R1 are alternately positioned in a first 4×4 arrangement structure, the basic units B2 and R2 are alternately positioned in a second 4×4 arrangement structure, the basic units B3 and R3 are alternately positioned in a second 4×4 arrangement structure, and the basic units B4 and R4 are alternately positioned in a fourth 4×4 arrangement structure. However, in FIG. 17F, although only a 6×6 arrangement is illustrated, an overall disposal is not illustrated, but a unit arrangement structure may be alternately positioned, and thus it is not difficult to check an overall structure.

According to an embodiment, it may be formed in various arrangements other than the arrangement illustrated in FIGS. 14A-14F to FIGS. 17A-17F.

A first opening and a second opening are positioned in the first insulating layer 550 of the display device according to an embodiment of FIGS. 14A-14F to FIGS. 17A-17F, and thus the extension is positioned not only in a cross direction, but also in an x-direction, thereby providing a structure that reduces differences in luminance and display quality depending on an azimuth angle.

In the above, various arrangements of two openings positioned in the first insulating layer 550 each has four extensions, and have different protrusion directions have been described.

Hereinafter, an embodiment in which the openings positioned in the first insulating layer 550 each have two extensions will be described with reference to FIG. 18 to FIG. 20.

FIG. 18 illustrates various embodiments depending on positions of an extension in a display device according to an embodiment, and FIG. 19 and FIG. 20 each illustrate a schematic top plan view showing a portion of a display area in a display device according to an embodiment.

Before describing FIG. 19 and FIG. 20, a basic unit structure in which the first opening and the second opening can be arranged will be described with reference to FIG. 18.

In FIG. 18, a first color R, a second color G, and a third color B are grouped to divide them into basic units, and in each basic unit, the openings positioned in the first insulating layer 550 each have only two extensions. Hereinafter, the openings of the first insulating layer 550 each having only two extensions are also referred to as third openings 551a-3, 551b-3, and 551c-3.

The third openings 551a-3, 551b-3, and 551c-3 are divided into four basic structures depending on a direction in which the two extensions protrude, and are divided into three depending on a color, and a total of 12 basic structures are illustrated in FIG. 18.

Referring to the direction, for the third openings 551a-3, 551b-3, and 551c-3 in FIG. 18, basic structures B1, R1, and G1 of each of the first color R, the second color G, and the third color B in which two extensions protrude in the first direction DR1 (or the horizontal direction), basic structures B2, R2, and G2 of each of the first color R, the second color G, and the third color B, in which two extensions protrude in the second direction DR2 (or the vertical direction), and basic structures B3, B4, R3, R4, G3, and G4 of each of the first color R, the second color G, and the third color B in which two extensions protrude in an oblique direction with respect to the first direction DR1 or the second direction DR2 are illustrated. By way of example, in the basic structures B3, R3, and G3, the third openings 551a-3, 551b-3, and 551c-3 of the first color R, the second color G, and the third color B, in which the two extensions protrude in a fifth direction DRd are included, and in the basic structures B4, R4, and G4, the third openings 551a-3, 551b-3, and 551c-3 of the first color R, the second color G, and the third color B, in which the two extensions protrude in a fourth direction DRc are included.

FIG. 18 illustrates a structure in which the third opening 551b-3 for the second color is arranged in two directions in one basic structure. The two directions in which the third opening 551b-3 for the second color is basically arranged may form a 90 degree angle with each other.

Although the basic structure of FIG. 18 may include only a structure in which protrusion directions of the two extensions of the third openings 551a-3, 551b-3, and 551c-3 form an angle of 180 degrees or about 180 degrees, a third opening in which the protruding directions of the two extensions form an angle of 90 degrees or about 90 degrees or 270 degrees or about 270 degrees may also be included according to an embodiment.

The basic structures B1, B2, B3, B4, R1, R2, R3, R4, G1, G2, G3, and G4 described in FIG. 18 may be positioned in various ways to form a display device, and all of the basic structures B1, B2, B3, B4, R1, R2, R3, R4, G1, G2, G3, and G4 may be included in one display device to reduce differences in luminance and display quality depending on the azimuth angle. For example, in case that all of the third openings 551*a*-3, 551*b*-3, and 551*c*-3 positioned in the first insulating layer 550 included in one display device are summed, an extension that protrudes in eight directions for each color may be included.

Some of various arrangements including all of the basic structures B1, B2, B3, B4, R1, R2, R3, R4, G1, G2, G3, and G4 included in FIG. 18 will be described as follows with reference to FIG. 19 and FIG. 20.

A structure of FIG. 19 will be described as follows.

The third opening 551*c*-3 for the third color and the third opening 551*a*-3 for the first color having two extensions protruding in the first direction DR1 are alternately positioned in a first row, and the third openings 551*b*-3 for the second color having two extensions protruding in the first direction DR1 are alternately positioned with different arrangement directions in a second row. The third opening 551*a*-3 for the first color and the third opening 551*c*-3 for the third color having two extensions protruding in the fifth direction DRd are alternately positioned in a third row, and the third openings 551*b*-3 for the second color having two extensions protruding in the fifth direction DRd are alternately positioned in different arrangement directions in a fourth row. The third opening 551*c*-3 for the third color and the third opening 551*a*-3 for the first color having two extensions protruding in the second direction DR2 are alternately positioned in a fifth row, and the third openings 551*b*-3 for the second color having two extensions protruding in the second direction DR2 are alternately positioned with different arrangement directions in a sixth row. The third opening 551*a*-3 for the first color and the third opening 551*c*-3 for the third color having two extensions protruding in the fourth direction DRc are alternately positioned in a seventh row, and the third openings 551*b*-3 for the second color having two extensions protruding in the fourth direction DRc are alternately positioned in different arrangement directions in an eighth row.

In FIG. 19, the display device included in FIG. 18 may include all of the basic structures B1, B2, B3, B4, R1, R2, R3, R4, G1, G2, G3, and G4, and thus the display quality may not change significantly depending on an azimuth angle by preventing the luminance from being high at a specific (or given) azimuth angle, thereby enabling a constant level of display quality to be displayed regardless of the azimuth angle.

A structure of FIG. 20 will be described as follows.

In FIG. 20, a third opening 551*c*-3 for the third color having two extensions protruding in the first direction DR1, a third opening 551*a*-3 for the first color having two extensions protruding in the second direction DR2, a third opening 551*c*-3 for the third color having two extensions protruding in the second direction DR2, and a third opening 551*a*-3 for the first color having two extensions protruding in the first direction DR1 are alternately positioned in a first row. A third opening 551*b*-3 for the second color having two extensions protruding in the fifth direction DRd, a third opening 551*b*-3 for the second color having two extensions protruding in the fourth direction DRc, a third opening 551*b*-3 for the second color having two extensions protruding in the second direction DR2, and a third opening 551*b*-3 for the second color having two extensions protruding in the first direction DR1 are alternately positioned in a second row. A third opening 551*a*-3 for the first color having two extensions protruding in the fourth direction DRc, a third opening 551*c*-3 for the third color having two extensions protruding in the fourth direction DRc, a third opening 551*a*-3 for the first color having two extensions protruding in the fifth direction DRd, and a third opening 551*c* for a third color having two extensions protruding in the fifth direction DRd are alternately positioned in a third row. A third opening 551*b*-3 for the second color having two extensions protruding in the second direction DR2, a third opening 551*b*-3 for the second color having two extensions protruding in the first direction DR1, a third opening 551*b*-3 for the second color having two extensions protruding in the fifth direction DRd, and a third opening 551*b*-3** for the second color having two extensions protruding in the fourth direction Drc are alternately positioned in a fourth row.

In FIG. 20, the display device included in FIG. 18 also may include all of the basic structures B1, B2, B3, B4, R1, R2, R3, R4, G1, G2, G3, and G4, and thus the display quality may not change significantly depending on an azimuth angle by preventing the luminance from being high at a specific (or given) azimuth angle, thereby enabling a constant level of display quality to be displayed regardless of the azimuth angle.

In FIG. 19 and FIG. 20, some examples of various arrangements that may include all of the basic structures B1, B2, B3, B4, R1, R2, R3, R4, G1, G2, G3, and G4 included in FIG. 18 are illustrated, and various arrangements other than that in FIG. 19 and FIG. 20 may be possible.

An embodiment in which the openings positioned in the first insulating layer 550 each have two extensions has been described with reference to FIG. 18 to FIG. 20.

Hereinafter, an embodiment in which the openings positioned in the first insulating layer 550 each have only one extension will be described with reference to FIG. 21 and FIG. 22.

FIG. 21 illustrates various embodiments depending on positions of an extension in a display device according to an embodiment, and FIG. 22 illustrates a schematic top plan view showing a portion of a display area in a display device according to an embodiment.

Before describing FIG. 22, a basic unit structure in which the first opening and the second opening can be arranged will be described with reference to FIG. 21.

In FIG. 21, a first color R, a second color G, and a third color B are grouped to divide them into basic units, and in each basic unit, the openings positioned in the first insulating layer 550 each have only one extension. Hereinafter, the openings of the first insulating layer 550 each having only one extension are also referred to as fourth openings 551*a*-4, 551*b*-4, and 551*c*-4.

The fourth openings 551*a*-4, 551*b*-4, and 551*c*-4 are divided into 8 basic structures depending on a direction in which one extension protrudes, and are divided into three depending on a color, and a total of 24 basic structures are illustrated in FIG. 21.

Referring to the direction, for the fourth openings 551*a*-4, 551*b*-4, and 551*c*-4 in FIG. 21, basic structures B1, R1, and G1 of each of the first color R, the second color G, and the third color B in which one extension protrudes in the second direction DR2, basic structures B2, R2, and G2 of each of the first color R, the second color G, and the third color B in which one extension protrudes in the fourth direction DRc, basic structures B3, R3, and G3 of each of the first color R, the second color G, and the third color B in which one extension protrudes in the first direction DR1, basic structures B4, R4, and G4 of each of the first color R, the second color G, and the third color B in which one extension protrudes in a direction opposite to the fifth direction DRd, basic structures B5, R5, and G5 of each of the first color R, the second color G, and the third color B in which one extension protrudes in a direction opposite to the second direction DR2, basic structures B6, R6, and G6 of each of the first color R, the second color G, and the third color B in which one extended part protrudes in a direction opposite to the fourth direction DRc, basic structures B7, R7, and G7 of each of the first color R, the second color G, and the third color B in which one extension protrudes in a direction opposite to the first direction DR1, and basic structures B8, R8, and G8 of each of the first color R, the second color G, and the third color B in which one extension protrudes in the fifth direction DRd are illustrated. By way of example, in the basic structures B3, R3, and G3, fourth openings 551a-4, 551b-4, and 551c-4 of the first color R, the second color G, and the third color B, in which one extension protrudes in the first direction DR1 is included, and in the basic structures B4, R4, and G4, the fourth openings 551a-4, 551b-4, 551c-4 of the first color R, the second color G, and the third color B, in which one extension protrudes in a direction opposite to the fifth direction DRd are included.

FIG. 21 illustrates a structure in which the fourth opening 551b-4 for the second color is arranged in two directions in one basic structure. The two directions in which the fourth opening 551b-4 for the second color is basically arranged may form a 90 degree angle with each other.

The basic structures B1 to B8, R1 to R8, and G1 to G8 described in FIG. 21 may be positioned in various ways to form a display device, and all of the basic structures B1 to B8, R1 to R8, and G1 to G8 may be included in one display device to reduce differences in luminance and display quality depending on the azimuth angle. For example, in case that all of the fourth openings 551a-4, 551b-4, and 551c-4 positioned in the first insulating layer 550 included in one display device are summed, an extension that protrude in eight directions for each color may be included.

One of various arrangements including all of the basic structures B1 to B8, R1 to R8, and G1 to G8 included in FIG. 21 will be described as follows with reference to FIG. 22.

In FIG. 22, a fourth opening 551a-4 for the first color having an extension protruding in the fifth direction DRd and a fourth opening 551c-3 for the third color having an extension protruding in the first direction DR1 are alternately positioned in a first row, and a fourth opening 551b-4 for the second color having an extension protruding in an opposite direction to the fourth direction DRc and a fourth opening 551b-4 for the second color having an extension protruding in the opposite direction to the second direction DR2 are alternately positioned in a second row. A fourth opening 551c-3 for the third color having an extension protruding in the opposite direction to the fifth direction DRd and a fourth opening 551a-4 for a first color having an extension protruding in the second direction DR2 are alternately positioned in a third row, and a fourth opening 551b-4 for the second color having an extension protruding in an opposite direction to the first direction DR1 and the fourth opening 551b-4 for the second color having an extension protruding in an opposite direction to the fourth direction DRc are alternately positioned in a fourth row. A fourth opening 551a-4 for the first color having an extension protruding in the fourth direction DRc and the fourth opening 551c-3 for the third color having an extension protruding in the opposite direction to the second direction DR2 are alternately positioned in a fifth row, and a fourth opening 551b-4 for a second color having an extension protruding in the fifth direction DRd and a fourth opening 551b-4 for the second color having an extension protruding in a direction opposite to the first direction DR1 are alternately positioned in a sixth row. A fourth opening 551c-3 for the third color having an extension protruding in an opposite direction to the fourth direction DRc and a fourth opening 551a-4 for the first color having an extension protruding in the first direction DR1 are alternately positioned in a seventh row, and a fourth opening 551b-4 for the second color having the extension protruding in the second direction DR2 and the fourth opening 551b-4 for the second color having the extension protruding in the fifth direction DRd are alternately positioned in an eighth row. A fourth opening 551a-4 for the first color having an extension protruding in an opposite direction to the fifth direction DRd and the fourth opening 551c-3 for the third color having an extension protruding in an opposite direction to the first direction DR1 are alternately positioned in a ninth row, and a fourth opening 551b-4 for the second color having the extension protruding in the fourth direction DRc and the fourth opening 551b-4 having the extension protruding in the second direction DR2 are alternately positioned in a tenth row. A fourth opening 551c-3 for the third color having an extension protruding in the fifth direction DRd and a fourth opening 551a-4 for the first color having an extension protruding in a direction opposite to the second direction DR2 are alternately positioned in an eleventh row, and a fourth opening 551b-4 for the second color having the extension protruding in the first direction DR1 and the fourth opening 551b-4 having the extension protruding in the fourth direction DRc are alternately positioned in a twelfth row. A fourth opening 551a-4 for the first color having an extension protruding in an opposite direction to the fourth direction DRc and the fourth opening 551c-3 for the third color having an extension protruding in the second direction DR2 are alternately positioned in a thirteenth row, and a fourth opening 551b-4 for the second color having an extension protruding in the opposite direction to the fifth direction DRd and the fourth opening 551b-4 for the second color having an extension protruding in the first direction DR1 are alternately positioned in a fourteenth row. A fourth opening 551c-3 for a third color having an extension protruding in the fourth direction DRc and a fourth opening 551a-4 for a first color having an extension protruding in a direction opposite to the first direction DR1 are alternately positioned in a fifteenth row, and a fourth opening 551b-4 for the second color having an extension protruding in an opposite direction to the second direction DR2 and the fourth opening 551b-4 for the second color having an extension protruding in the opposite direction to the fifth direction DRd are alternately positioned in a sixteenth row.

In FIG. 22, the display device included in FIG. 21 also may include all of the basic structures B1 to B8, R1 to R8, and G1 to G8, and thus the display quality may not change significantly depending on an azimuth angle by preventing the luminance from being high at a specific (or given) azimuth angle, thereby enabling a constant level of display quality to be displayed regardless of the azimuth angle.

In FIG. 22, some examples of various arrangements that may include all of the basic structures B1 to B8, R1 to R8, and G1 to G8 included in FIG. 21 are illustrated, and various arrangements other than that in FIG. 22 may be possible.

In the above, an embodiment in which one opening formed in the first insulating layer 550 has four, two, or one extension has been described, but the disclosure is not limited thereto, and it may have three extensions, or may have five or more extensions. The direction in which the extension protrudes may be more diverse.

In the above, an embodiment in which all of the first to fourth openings formed in the first insulating layer 550 do not overlap the sensing electrode 540 in a plan view has been described. However, according to an embodiment, a portion of an extension of at least one of the first to fourth openings formed in the first insulating layer 550 may overlap a portion of the sensing electrode 540 in a plan view. Hereinafter, an embodiment in which the planar extension and the sensing electrode 540 overlap each other will be described with reference to FIG. 23.

FIG. 23 illustrates a schematic top plan view showing a modification of FIG. 9.

An embodiment of FIG. 23 is an embodiment having a same arrangement as that of FIG. 9, and unlike in FIG. 9, extensions 552' and 553' overlap the sensing electrode 540 in a plan view. For example, edges of the first openings 551a-1', 551b-1', and 551c-1' and the second openings 551a-2', 551b-2', and 551c-2' of the first insulating layer 550, including each of the first extensions 552' (552a', 552b', and 552c') and the second extensions 553' (553a', 553b', and 553c') overlap the sensing electrode 540, and lengths of the first extensions 552' and the second extensions 553' are also formed long to overlap the sensing electrode 540. A portion where the first and second extensions 552' and 553' overlap the sensing electrode 540 in a plan view may be an end of the first extension 552' and the second extension 553'.

As illustrated in FIG. 9, in an embodiment of FIG. 23, a direction in which the first extension 552' and the second extension 553' protrude may include at least eight directions, and may have constant display quality irrespective of an azimuth angle.

Referring to FIG. 10, it can be seen that transmittance of light decreases toward a side where the extensions 552' and 553' are positioned. Accordingly, even in case that the extensions 552' and 553' overlap the sensing electrode 540, a portion where the transmittance is reduced overlaps the sensing electrode 540, and thus a same display quality as that of an embodiment of FIG. 9 may be maintained without substantially reducing the transmittance at the front.

FIG. 23 illustrates a modification of an embodiment of FIG. 9, and in all of the above-described embodiments, the extension of each opening formed in the first insulating layer 550 may overlap the sensing electrode 540 in a plan view.

While this disclosure has been described, it is to be understood that the disclosure is not limited to the disclosed embodiments, but, on the contrary, is intended to cover various modifications and equivalent arrangements included within the spirit and scope of the appended claims.

What is claimed is:
1. A display device comprising:
pixel electrodes disposed on a substrate;
a pixel defining layer disposed on the pixel electrodes, the pixel defining layer including pixel openings overlapping the pixel electrodes in a plan view;
an encapsulation layer disposed on the pixel electrodes and the pixel defining layer;
a sensing electrode disposed on the encapsulation layer;
a first insulating layer disposed on the sensing electrode, the first insulating layer has openings overlapping the pixel openings in the plan view, respectively; and
a second insulating layer disposed on the first insulating layer, a refractive index of the first insulating layer is smaller than a refractive index of the second insulating layer, wherein each of the openings of the first insulating layer includes protruding extensions, and
protruding directions of the protruding extensions formed in each of the openings are oriented in four of eight directions.

2. The display device of claim 1, wherein the eight directions include cross-shaped directions and x-shaped directions.

3. The display device of claim 2, wherein
each of the openings of the first insulating layer has four extensions,
the openings include a first opening and a second opening,
the four extensions of the first opening protrude in the cross-shaped directions, and
the four extensions of the second opening protrude in the x-shaped directions.

4. The display device of claim 2, wherein
each of the openings of the first insulating layer has two extensions, and
four of the openings have eight directions.

5. The display device of claim 2, wherein
each of the openings of the first insulating layer has one extension, and
eight of the openings have eight directions.

6. The display device of claim 2, wherein the protruding extensions protruding from some of the openings include first extensions disposed where edges of the some of the openings meet and extend in different directions.

7. The display device of claim 6, wherein the protruding extensions protruding from others of the openings further include second extensions disposed at central portions of edges of the others of the openings of the first insulating layer.

8. The display device of claim 7, wherein a length of each of the second extensions is equal to or less than a length of each of the first extensions.

9. The display device of claim 6, wherein
the first extensions include:
a first subextension and a second subextension extending in a direction parallel to a first direction; and
a third subextension and a fourth subextension extending in a direction parallel to a second direction different from the first direction,
an imaginary first line overlapping the first subextension in the plan view and parallel to the first direction and an imaginary second line overlapping the second subextension in the plan view and parallel to the first direction do not overlap, and
a third imaginary line overlapping the third subextension in the plan view and parallel to the second direction and a fourth imaginary line overlapping the fourth subextension in the plan view and parallel to the second direction do not overlap.

10. The display device of claim 2, wherein
lengths of the protruding extensions protruding from the openings are greater than widths of the protruding extensions protruding from the openings, and
the widths of the protruding extensions are greater than about 0 μm and less than about 4 μm, and the widths of the protruding extensions decrease away from edges of the openings of the first insulating layer.

11. The display device of claim 1, wherein a thickness of the second insulating layer is about 9 μm or more and about 11 μm or less.

12. The display device of claim 1, wherein
the pixel opening includes edges extending in different directions, and

the pixel opening has a polygonal planar shape including at least one chamfered edge.

13. The display device of claim 1, wherein the openings of the first insulating layer are larger than the pixel openings on a plane parallel to a surface of the substrate, and edges of the openings of the first insulating layer are disposed outside of edges of the pixel openings.

14. The display device of claim 1, wherein a portion of one of the protruding extensions overlaps a portion of the sensing electrode in the plan view.

15. The display device of claim 14, wherein the portion of the one of the protruding extensions overlapping the portion of the sensing electrode in the plan view is an end of the extension.

16. An electronic device comprising:
a housing including a rear surface and a side surface;
a cover window disposed at an upper portion of the housing; and
a display panel disposed at a lower portion of the cover window to include a display area, wherein the display panel includes:
pixel electrodes disposed on a substrate;
a pixel defining layer disposed on the pixel electrodes, the pixel defining layer including pixel openings overlapping the pixel electrodes in a plan view;
an encapsulation layer disposed on the pixel electrodes and the pixel defining layer;
a sensing electrode disposed on the encapsulation layer;

40 a first insulating layer disposed on the sensing electrode, the first insulating layer including openings overlapping the pixel openings in the plan view, respectively; and
a second insulating layer disposed on the first insulating layer, a refractive index of the first insulating layer is smaller than a refractive index of the second insulating layer, wherein
wherein each of the openings of the first insulating layer includes protruding extensions, and
protruding directions of the protruding extensions formed in each of the openings are oriented in four of eight directions.

17. The electronic device of claim 16, wherein the eight directions include cross-shaped directions and x-shaped directions.

18. The electronic device of claim 17, wherein the protruding extensions protruding from some of the openings of the first insulating layer include first extensions disposed where edges of the some of the openings meet and extend in different directions.

19. The electronic device of claim 18, wherein the protruding extensions protruding from others of the openings include second extensions disposed at central portions of edges of the others of the openings of the first insulating layer.

20. The electronic device of claim 16, wherein a portion of at least one of the protruding extensions overlaps a portion of the sensing electrode in the plan view.

* * * * *